US010254823B2

(12) United States Patent
Artieri et al.

(10) Patent No.: US 10,254,823 B2
(45) Date of Patent: Apr. 9, 2019

(54) POWER MANAGEMENT USING DUTY CYCLES

(71) Applicant: QUALCOMM Incorporated, San Diego, CA (US)

(72) Inventors: Alain Artieri, San Diego, CA (US); Jean-Marie Tran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 128 days.

(21) Appl. No.: 15/471,865

(22) Filed: Mar. 28, 2017

(65) Prior Publication Data

US 2018/0284878 A1    Oct. 4, 2018

(51) Int. Cl.
G06F 1/00       (2006.01)
G06F 1/3296    (2019.01)
G06F 1/324     (2019.01)
H03K 5/156     (2006.01)
G06F 1/18      (2006.01)

(52) U.S. Cl.
CPC ............ G06F 1/3296 (2013.01); G06F 1/189 (2013.01); G06F 1/324 (2013.01); H03K 5/1565 (2013.01); Y02D 10/126 (2018.01); Y02D 10/172 (2018.01)

(58) Field of Classification Search
None
See application file for complete search history.

(56) References Cited

U.S. PATENT DOCUMENTS

| 9,246,492    | B1 | 1/2016  | Sood           |
|--------------|----|---------|----------------|
| 2006/0259800 | A1 | 11/2006 | Maejima        |
| 2015/0143142 | A1 | 5/2015  | Park et al.    |
| 2016/0026227 | A1 | 1/2016  | Kharbutli et al. |
| 2016/0109932 | A1 | 4/2016  | Jeon           |
| 2016/0111134 | A1 | 4/2016  | Kim et al.     |

OTHER PUBLICATIONS

International Search Report and Written Opinion—PCT/US2018/017274—ISA/EPO—dated May 22, 2018.

Primary Examiner — Nitin C Patel
(74) Attorney, Agent, or Firm — Colby Nipper / Qualcomm

(57) ABSTRACT

An integrated circuit (IC) is disclosed herein for power management using duty cycles. In an example aspect, the integrated circuit includes multiple power domains, each of which includes a respective power state controller. The power state controller acts as a bridge between global supply lines of the integrated circuit and local supply lines of the respective power domain. Global supply lines can include a first global power rail, a second global power rail, and a global clock tree. Local supply lines can include a local power rail and a local clock tree. In operation, a power state controller adjusts a power state of the respective power domain in accordance with a duty cycle. A timeslot corresponding to the duty cycle can be separated into multiple time periods with durations of the time periods being based on the duty cycle.

42 Claims, 19 Drawing Sheets

POWER MANAGEMENT USING DUTY CYCLES

TECHNICAL FIELD

This disclosure relates generally to power management of integrated circuits (ICs) that are used in electronic devices and, more specifically, to implementing duty cycling to increase the effective variety or granularity of the power states that are available on a per-power-domain basis so as to facilitate efficient power consumption.

BACKGROUND

Power consumption by electronic devices is an increasingly important factor in the design of electronic devices. From an environmental perspective, the energy consumption of electronic devices occupies a sizable percentage of total energy usage due to large corporate data centers and the ubiquity of personal computing devices. Environmental concerns thus motivate efforts to reduce the power consumed by electronic devices to help conserve the earth's resources. From a financial perspective, less power consumption translates to lower energy bills for both corporations and individuals.

Furthermore, from a convenience perspective, many personal electronic devices are portable and therefore powered by batteries. The less energy that is consumed by a portable battery-powered electronic device, the longer the portable device can operate without recharging the battery. Lower energy consumption also enables the use of smaller batteries and the adoption of thinner form factors, which means electronic devices can be made more portable or versatile. Thus, the popularity of portable electronic devices also motivates efforts to reduce the power consumption of electronic devices.

An electronic device consumes power if the device is coupled to a power source and is turned on. This is true for the entire electronic device, but it is also true for individual parts of the electronic device. Hence, power consumption can be reduced if parts of an electronic device are powered down, even while other parts remain powered up. Entire discrete components of an electronic device, such as a whole integrated circuit (IC) chip or a display screen, may be powered down. Alternatively, selected parts of a discrete component may likewise be powered down. For example, a distinct processing entity or a circuit block of an integrated circuit chip, such as a core thereof, may be selectively powered down for some period of time to reduce energy consumption.

A portion of an integrated circuit, such as a core, can therefore be powered down to reduce power consumption, which conserves energy and extends the battery life of portable electronic devices. A core can be powered down by decoupling the core from a power source or by turning the power source off. This causes the core to cease using energy. Additionally, a core can be powered down by lowering a voltage supplied to the core or lowering a frequency at which the core operates. Lowering a voltage or a frequency of operation can therefore reduce the energy used by the core. Thus, as used herein, the term "powering down" can include ceasing energy usage or reducing energy usage.

Given these factors, two conventional approaches to reducing energy usage have been developed for integrated circuits. One approach to reducing the energy usage of a block of an integrated circuit is to supply a lower voltage level to the block. This approach is called dynamic voltage scaling (DVS). With DVS, power usage by a block can be managed by lowering a supply voltage during times of reduced circuitry utilization and then raising the supply voltage to meet higher utilization demands. Another approach to reducing the energy usage of a block of an integrated circuit entails lowering a frequency of a clock signal supplied to the block. This approach is called dynamic frequency scaling (DFS). Similar to DVS, power usage by a block can be managed with DFS by reducing a clock frequency during times of reduced circuitry utilization and then raising the clock frequency to meet higher utilization demands.

DVS and DFS can also be used together to implement dynamic voltage and frequency scaling (DVFS). With DVFS, a supply voltage or a clock frequency, including possibly both, are adjusted to change a current power consumption level of a block. Thus, DVS, DFS, or DVFS can be employed as a power management technique to reduce the power consumption of electronic devices.

Unfortunately, implementing DVS or DFS individually or in a combined manner as DVFS is challenging. For example, implementing conventional approaches to voltage or frequency scaling can adversely impact the performance of an integrated circuit, especially during phases in which the voltage or frequency is actually being changed. Typically, processing is halted during voltage or frequency transitional phases. Consequently, overall data throughput is slowed as a result of efforts to reduce power consumption. Furthermore, conventional approaches to voltage scaling have resulted in complicated chip layouts with substantial areas of the chip devoted to different power rails that are held at different voltages at different times. These issues have hindered the deployment of DVS, DFS, and DVFS and have therefore prevented the attainment of the full power-conserving potential of voltage and frequency scaling.

SUMMARY

In an example aspect, an integrated circuit is disclosed. The integrated circuit includes a first global power rail, a second global power rail, and a global clock tree. The first global power rail is configured to be held at a first global voltage, and the second global power rail is configured to be held at a second global voltage. The global clock tree is configured to propagate a global clock signal. The integrated circuit also includes multiple power domains, with each power domain including a respective power state controller. The power state controller includes a power multiplexer, a frequency divider, and a duty cycle manager. The power multiplexer is coupled to the first global power rail and the second global power rail. The frequency divider is coupled to the global clock tree. The duty cycle manager is configured to adjust a power state of a respective power domain of the multiple power domains based on a duty cycle parameter using the power multiplexer and the frequency divider.

In an example aspect, an integrated circuit is disclosed. The integrated circuit includes a first global power rail, a second global power rail, a global clock tree, and multiple power domains. The first global power rail is configured to be held at a first global voltage, and the second global power rail is configured to be held at a second global voltage. The global clock tree is configured to propagate a global clock signal. Each power domain of the multiple power domains includes a local power rail, a local clock tree, and a circuit load. The local power rail is configured to be held at a local voltage, and the local clock tree is configured to propagate a local clock signal. The circuit load is coupled to the local power rail and the local clock tree, with the circuit load configured to operate using the local voltage and the local clock signal. Each power domain further includes power state control means for adjusting a power state of the circuit load in accordance with a duty cycle corresponding to a timeslot that is separated into multiple time periods. The power state control means is configured to couple at least the first global power rail or the second global power rail to the local power rail and the global clock tree to the local clock tree.

In an example aspect, a method for power management using duty cycles is disclosed. The method includes distributing multiple global voltages to each of multiple power domains of an integrated circuit via multiple global power rails. The method also includes propagating a global clock signal to each of the multiple power domains of the integrated circuit via a global clock tree. The method further includes controlling power states in respective ones of the multiple power domains, with each respective power domain having a circuit load. The controlling within a respective power domain includes distributing a local voltage to the circuit load of the respective power domain via a local power rail. The controlling also includes propagating a local clock signal to the circuit load of the respective power domain via a local clock tree. The controlling further includes adjusting the local voltage and the local clock signal of the respective power domain using the multiple global voltages and the global clock signal in accordance with a duty cycle corresponding to a timeslot including multiple time periods per timeslot. Each respective time period of the duty cycle corresponds to a respective power state having a voltage-frequency setting.

In an example aspect, an integrated circuit is disclosed. The integrated circuit includes a first global power rail, a second global power rail, and a global clock tree. The first global power rail is configured to be held at a first global voltage, and the second global power rail is configured to be held at a second global voltage. The global clock tree is configured to propagate a global clock signal. The integrated circuit also includes multiple power domains, with each power domain including a local power rail, a local clock tree, and power state control circuitry. The local power rail is configured to be held at a local voltage, and the local clock tree is configured to propagate a local clock signal. The power state control circuitry is configured to implement a finite state machine, which includes a first power state and a second power state. The first power state corresponds to the local power rail being coupled to the first global power rail and the local clock signal being a function of the global clock signal and a first divisor value. The second power state corresponds to the local power rail being coupled to the second global power rail and the local clock signal being a function of the global clock signal and a second divisor value. The finite state machine is configured to trigger a state transition based on at least one timer that is derived from a duty cycle.

DETAILED DESCRIPTION

Figure 1:
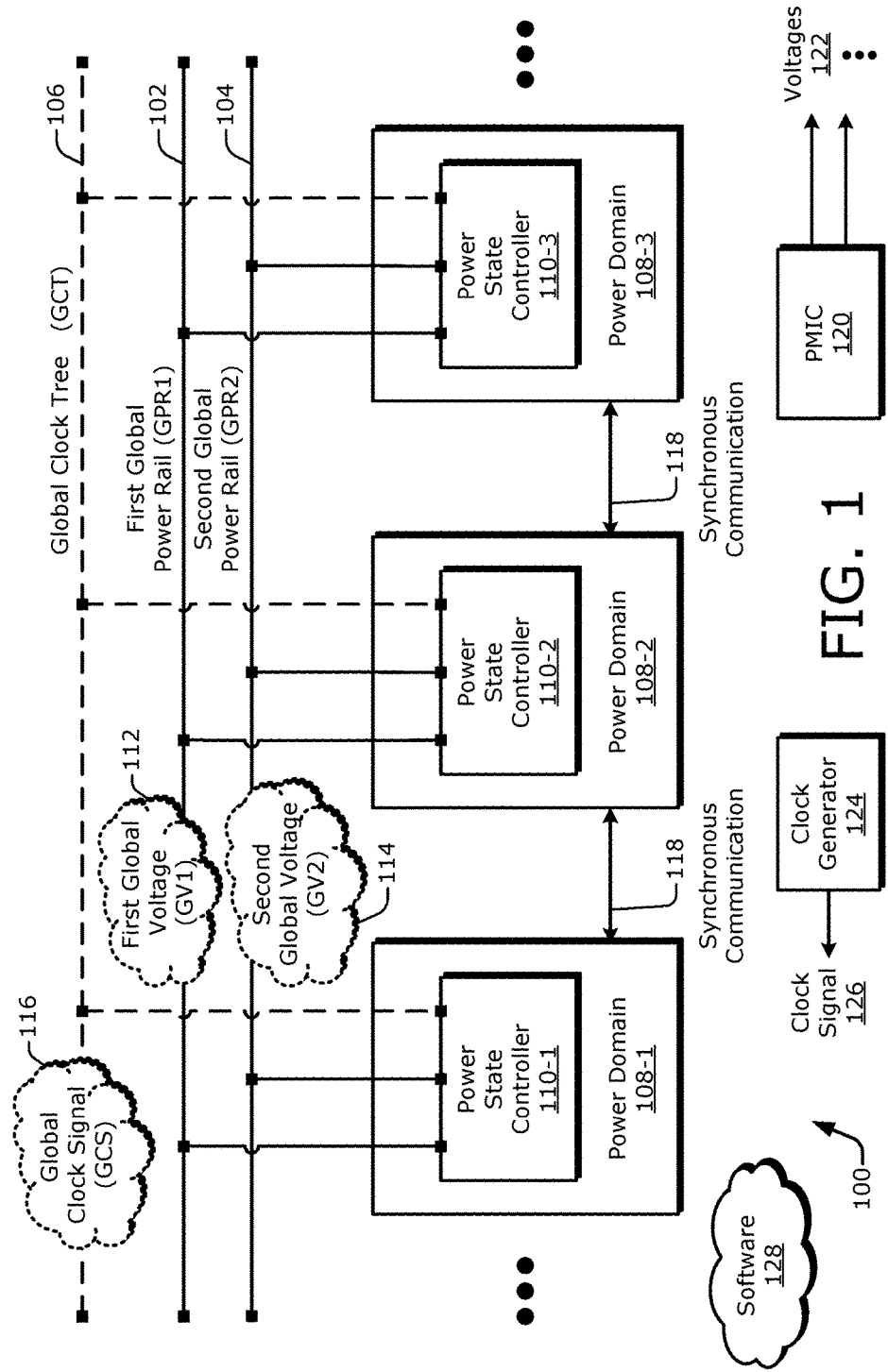
FIG. 1 illustrates an example portion of an integrated circuit that includes multiple power domains in which duty cycling can be implemented.

Power management of electronic devices entails controlling an amount of energy that an integrated circuit (IC) consumes over time or on an instantaneous basis. Energy consumption can be reduced to zero or near zero during times of nonuse if an integrated circuit is powered down completely. At times of lower utilization or to retain some stored data, an integrated circuit may be powered down partially by lowering a voltage or frequency level to reduce power consumption. Also, if an integrated circuit cannot be powered down as a whole, then one or more portions, or blocks, may be powered down independently of one another.

Dynamic voltage scaling (DVS), dynamic frequency scaling (DFS), and dynamic voltage and frequency scaling (DVFS) are implemented by changing a voltage level, a frequency level of a clock signal, and both a voltage level and a frequency level, respectively. A particular voltage level in combination with a particular frequency level is referred to herein as a voltage-frequency setting that forms a power state. The voltage level or the frequency level of a voltage-frequency setting can be adjusted to institute a new power state. The voltage or the frequency of a voltage-frequency setting can be increased to raise a performance level of an integrated circuit even though the energy consumption is likewise being increased. Conversely, the voltage or the frequency can be decreased to decrease the energy consumed by the operation of the integrated circuit even though a cost is that the performance level is also lowered. Generally, higher performance corresponds to higher power consumption, and lower performance corresponds to lower power consumption. DVS, DFS, and DVFS can therefore be effective tools at managing the power consumed by integrated circuits in an attempt to balance performance levels versus power consumption. Conventional approaches to implementing these tools, however, create a number of problems.

With respect to a first problem with conventional approaches to scaling voltage or frequency, a power distribution network (PDN) of an integrated circuit becomes fragmented. This fragmentation complicates both the design and the operation of an integrated circuit chip and also causes additional area on the chip to be occupied by the PDN. The fragmentation is created because different blocks of an integrated circuit are utilized at different times, in different manners, and with different intensities. Accordingly, different blocks are provided different voltage levels at different times. To accommodate this situation, conventional voltage scaling constructs numerous different power rails to distribute different voltage levels to different blocks. These numerous power rails require space on the chip and can involve greater coordination between blocks, as is described below.

With respect to a second problem with conventional approaches to scaling voltage or frequency, sub-optimal power situations develop in which blocks are relegated to operating at a power level that is greater than that which is currently required. Although conventional approaches result in numerous different power rails, the total number of different blocks on some integrated circuit chips, such as a system on a chip (SOC), still exceed the number of power rails. A single given power rail therefore provides a voltage supply to multiple different blocks of the integrated circuit. Consequently, there are times when a block that requires a higher voltage level for current operation imposes this higher voltage level on another block that is currently capable of operating at a lower voltage level, which wastes power. Attempts to reduce how often this occurs involves greater coordination between integrated circuit blocks and the software or firmware that is controlling the blocks, which results in additional complications when using a conventional approach.

With respect to a third problem with conventional approaches to scaling voltage or frequency, there is a large penalty in terms of both time and energy for transitioning between power states. A device called a power management integrated circuit (PMIC) is typically employed to provide a voltage level to a given power rail. The PMIC takes on the order of 100 microseconds (µsecs) to adjust a voltage level. Changing the voltage level also entails switching relatively large capacitors, which can be on the order of 10 microfarads (µF). Charging such large capacitors incurs an energy cost. Changing an output of a clock generator, such as a phase-locked loop (PLL), is likewise relatively slow. To adjust a frequency level, the clock generator also typically takes on the order of 100 microseconds (µsecs). These time and energy penalties retard how often transitions between different voltage or frequency levels can be made, especially because processing utilization levels can change quickly. Consequently, some power rails, and any blocks that are powered therefrom, operate for extended durations at a higher-than-necessary voltage or frequency level because there is not sufficient time to make a transition to another voltage-frequency setting.

With respect to a fourth problem with conventional approaches to scaling voltage or frequency, voltage-frequency settings are heavily quantized in the sense that there are large performance/efficiency steps between adjacent power states. In other words, there are a limited number of fixed power states available for operation of a block of an integrated circuit. For example, consider a situation in which there is one step from a power state "A" to a power state "B," and nothing is available between the two adjacent power states. In this situation, a condition can arise in which an ideal voltage-frequency setting that properly balances currently-existing performance demands against power consumption is between the two available power states "A" and "B." Unfortunately, this ideal voltage-frequency setting cannot be attained because there is no intermediate power state between the two sole or adjacent power states "A" and "B."

Furthermore, this ideal voltage-frequency setting cannot be approximated because of the time and energy penalties incurred by transitioning between the two adjacent power states "A" and "B" using conventional approaches to voltage and frequency scaling. For example, because processing throughput is idled during transition times between different power states, the portion of time that a circuit is not processing data would become too long if a voltage or a frequency were to be changed too often. Additionally, because voltage and frequency changes consume so much time with conventional approaches, lowering a voltage or a frequency for short durations of time is infeasible when forecasted processing demands indicate that a higher voltage or frequency will be needed in the near future.

In contrast, circuitry and processes described herein enable voltage levels and frequency levels to be adjusted at a rate that permits approximation of intermediate voltage-frequency settings. Moreover, voltage-frequency settings can be switched sufficiently fast so as to approximate a nearly continuous range of power states over some extended timeframe. In other words, an effective average power consumption level can be achieved from a lowest voltage-frequency setting to a highest voltage-frequency setting by repeatedly switching between two or more power states. For example, by repeatedly switching between a lower power consumption/lower performance power state and a higher power consumption/higher performance power state, an average power consumption level is established that is between the lower and higher power consumption levels. Relative time periods for operation under the two different power states can control the level of the average power consumption. For instance, if a duration for the time period corresponding to the lower power consumption/lower performance power state is lengthened relative to a duration for the time period corresponding to the higher power consumption/higher performance power state, the average power consumption level is lowered, and vice versa. As described below, a power management scheme can manage power consumption by implementing a duty cycle parameter that controls the relative lengths of the durations of the time periods respectively corresponding to different power states.

In some example implementations, power management schemes are described that realize a power distribution network having multiple independent power domains and a reduced number of global power rails. In some other example implementations, power management schemes are described in which blocks of an integrated circuit change power states in accordance with a duty cycle. In still other example implementations, power management schemes are described that synergistically combine the power distribution network architecture having independent power domains with circuitry that performs the duty cycling. Nevertheless, the power distribution network architecture and the duty cycling may be implemented separately.

In example implementations, an integrated circuit chip has a power distribution network that includes a first global power rail distributing a first global voltage, a second global power rail distributing a second global voltage, and multiple power domains. The integrated circuit chip also has a global clock tree that propagates a global clock signal. Each power domain taps into the first global power rail, the second global power rail, and the global clock tree. Each power domain includes a respective power state controller configured to independently establish a respective power state for the respective power domain using the first global voltage, the second global voltage, and the global clock signal. Although certain examples are described in terms of two global power rails and two associated global voltages, each power domain may alternatively be coupled to three or more global power rails to have access to three or more global voltages. Also, as used herein, the term "global" conveys that a corresponding item (e.g., power rail, voltage, clock tree, or clock signal) is associated with multiple domains. However, an integrated circuit may include other power rails, clock trees, and so forth, including those that supply other power domains. Thus, other power domains may receive separate voltages, clock signals, and so forth.

The power state controller of a respective power domain includes a power multiplexer, a frequency divider, and circuitry to control the power state of the power domain. The power multiplexer is coupled to the first global power rail and the second global power rail. The frequency divider is coupled to the global clock tree. Each power domain further includes a local power rail and a local clock tree. The circuitry of the power state controller controls the power multiplexer to selectively connect the first global power rail or the second global power rail to the local power rail. This establishes a local voltage on the local power rail. The circuitry also controls the frequency divider to divide the global clock signal of the global clock tree. This establishes a local clock signal on the local clock tree. Thus, the power state controller can establish a respective power state for a given power domain independently of the power states for other power domains. If a third global power rail is implemented, the power state controller can establish at least one additional power state using a third global voltage of the third global power rail by selectively connecting the third global power rail to the local power rail. The power state controller can establish, for example, at least one power state per global power rail.

In these manners, fragmentation of a power distribution network is at least reduced because just a few global power rails (e.g., 2-4 global power rails) are routed across an integrated circuit chip to most, if not all, blocks. Also, sub-optimal power situations can be ameliorated because different blocks with different power preferences can be placed in different power domains, which have independent power states. Additionally, transition times are dramatically reduced. The power multiplexer can effect a voltage level adjustment to the local voltage in under 100 nanoseconds (nsecs), on the order of 10 s of nanoseconds, and in as few as just 10 nanoseconds. Similarly, the frequency divider can effect a frequency level adjustment to the local clock signal in under 100 nanoseconds, on the order of 10 s of nanoseconds, and in as few as just 10 nanoseconds. The voltage adjustment or the frequency adjustment can therefore be made two to three orders of magnitude faster than with conventional approaches. Furthermore, the energy penalty for power state transitions that adversely affects conventional approaches is alleviated because large capacitors at the PMIC need not be switched.

In other example implementations, the power state controller in at least some power domains further includes a duty cycle manager. The duty cycle manager adjusts a power state of a respective power domain in accordance with a duty cycle parameter using the power multiplexer and the frequency divider to establish a duty cycle for the respective power domain. In a scenario with an example two power states, the duty cycle is organized into or realized as a recurrent timeslot having a duration that is separated into two time periods, with each time period corresponding to a respective power state. Accordingly, the duty cycle manager causes the power multiplexer to select the first global power rail or the second global power rail for connection to the local power rail in dependence on which time period is currently in effect of the two time periods of the recurrent timeslot. The duty cycle manager also causes the frequency divider to divide the global clock signal by a selected divisor value to produce the local clock signal in dependence on which time period is currently in effect of the at least two time periods of the recurrent timeslot.

Thus, power state adjustments can be triggered responsive to expiration of at least one timer that is set to adhere to one or more durations associated with the duty cycle. Relative durations of the two time periods can be changed using a performance level indicator signal generated, for instance, by software or firmware or by a hardware controller. The performance level indicator signal includes a duty cycle parameter, such as a value that represents a portion of the duration of the timeslot. A value of 20%, for instance, causes one time period to last 20% of the total timeslot duration and the other time period to last 80% of the total timeslot duration. Changing the relative proportions of time periods for a given timeslot changes the average power consumption of the power domain over the given timeslot. Changing the relative proportions of time periods over multiple different timeslots enables an almost continuous adjustability of the average power consumption over longer timeframes.

In these manners, the strict quantization that impacts conventional approaches to voltage and frequency scaling is overcome. The power-domain-based architecture that is described herein enables significantly faster voltage and frequency adjustment. Because a voltage and a frequency transition can be accomplished in less than a tenth of a microsecond, such transitions can be made frequently without an appreciable effect on the processing throughput. With rapid adjustments between two or more power states, the average power consumption of a power domain can be substantially continuously adjustable across a range of power consumption levels over longer timeframes by adjusting the relative durations of two or more time periods of a duty cycle that respectively correspond to the two or more power states. By employing recurring timeslots having the time periods indicated by a duty cycle parameter as part of a duty cycle implementation, the utilization of voltage-frequency settings that fall between two quantized power states can be effectively approximated.

FIG. 1 illustrates an example portion of an integrated circuit 100 that includes multiple power domains, such as a first power domain 108-1, a second power domain 108-2, and a third power domain 108-3. The integrated circuit 100 includes multiple power rails and at least one clock tree. As shown at a relatively high level in FIG. 1, the integrated circuit 100 includes a first global power rail 102 (GPR1), a second global power rail 104 (GPR2), and a global clock tree 106 (GCT). These global supply lines distribute a voltage having a voltage level or a clock signal have a frequency level to each power domain 108 of the multiple power domains 108-1 to 108-3. Although three power domains 108-1 to 108-3 are explicitly depicted in FIG. 1, the integrated circuit 100 can alternatively include more or fewer power domains. In the accompanying drawings, the various clock paths, such as that of the global clock tree 106, is depicted using dashed lines to visually differentiate clock paths from voltage power rails.

Each respective power domain 108-1, 108-2, and 108-3 is depicted as including one respective power state controller 110-1, 110-2, and 110-3. Thus, the first power domain 108-1 includes a first power state controller 110-1, the second power domain 108-2 includes a second power state controller 110-2, and the third power domain 108-3 includes a third power state controller 110-3. However, a power domain 108 may alternatively operate without a power state controller (e.g., see FIG. 2). FIG. 1 also illustrates a power management integrated circuit 120 (PMIC), a clock generator 124, and software 128. Generally, the software 128 or firmware (not shown) can execute on the integrated circuit 100, can execute on a different integrated circuit (not shown), can provide signaling to control operation of the multiple power domains 108-1 to 108-3 or other portions of the integrated circuit 100, and so forth.

Each power domain 108 is illustrated as being coupled to the first global power rail 102, the second global power rail 104, and the global clock tree 106. In some example implementations, each respective power domain 108 can be coupled to the first global power rail 102, the second global power rail 104, and the global clock tree 106 via a respective power state controller 110. The first global power rail 102 is held at a first global voltage 112 (GV1), and the second global power rail 104 is held at a second global voltage 114 (GV2). The global clock tree 106 propagates a global clock signal 116 (GCS) to various circuitry disposed around the integrated circuit 100. Thus, each power state controller 110 receives the first global voltage 112 via the first global power rail 102, the second global voltage 114 via the second global power rail 104, and the global clock signal 116 via the global clock tree 106. Although two global power rails and one global clock tree are explicitly shown in FIG. 1, more than two global power rails or more than one clock tree can be implemented. For example, the global supply lines may include a third global power rail that is held at a third global voltage.

The multiple global power rails form at least part of a power distribution network (PDN) that distributes power to different locations and various circuitry around the integrated circuit 100, including the multiple power domains 108-1 to 108-3. The power management integrated circuit 120 is implemented as a voltage source to supply voltages 122 to the global power rails at specified voltage levels through voltage conversion or regulation. Thus, the first global power rail 102 and the second global power rail 104 are held at the first global voltage 112 and the second global voltage 114, respectively, by the power management integrated circuit 120. Unless indicated otherwise herein, the first global voltage 112 has a higher voltage level than the second global voltage 114 for explanatory purposes; however, voltage levels may change from time to time. Although the power management integrated circuit 120 is illustrated in FIG. 1 as being part of the integrated circuit 100, the power management integrated circuit 120 can instead be implemented external to the integrated circuit 100. In other words, the power management integrated circuit 120 can be disposed on the same integrated circuit chip as the multiple global power rails or can be located on a different integrated circuit chip.

Similarly, the clock generator 124 can be disposed on the same integrated circuit chip as the global clock tree 106 or can be located on a different integrated circuit chip. The clock generator 124 generates a clock signal 126 that is provided to the global clock tree 106 to produce the global clock signal 116. The clock generator 124 can be implemented using, for example, phase-locked loop (PLL) circuitry that produces the clock signal 126. Although a frequency value of the global clock signal 116 can change from time to time, the frequency value is generally fixed for extended periods of time. However, each power state controller 110 is configured to change the frequency value of a local clock signal on a per-power domain basis, as is described herein. With local control of a frequency value of a respective local clock signal by a respective power state controller 110, each respective power domain 108 can operate at different frequencies. Nevertheless, synchronous communication 118 between power domains 108 is enabled as described herein.

Figure 2:
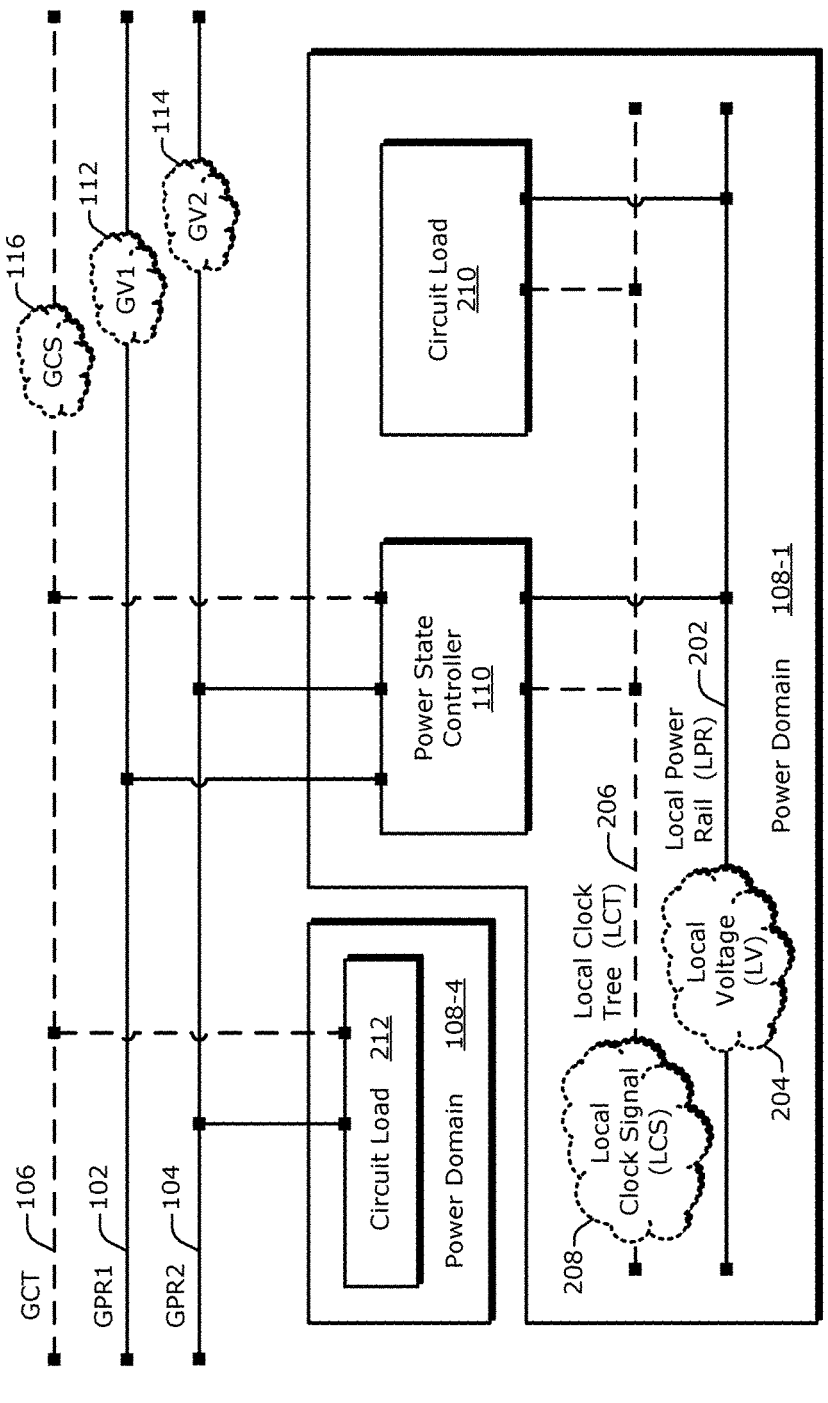
FIG. 2 illustrates an example operational interface between global supply lines of the integrated circuit and local supply lines of a power domain via a power state controller that can implement duty cycling.

FIG. 2 illustrates an example operational interface 200 between global supply lines of the integrated circuit and local supply lines of a power domain 108-1 via a power state controller 110. The global supply lines include the first global power rail 102, the second global power rail 104, and the global clock tree 106. The local supply lines include a local power rail 202 (LPR) and a local clock tree 206 (LCT). The local power rail 202 is held at a local voltage 204 (LV). The local clock tree 206 propagates a local clock signal 208 (LCS) for the power domain 108-1. The power domain 108-1 also includes the power state controller 110 and a circuit load 210. FIG. 2 further illustrates a power domain 108-4, which includes a circuit load 212. The circuit load 210 and the circuit load 212 each includes a collection of digital circuits that operate using supplied voltage and current in accordance with a supplied clock signal, as is described below.

The circuit load 212 is coupled to the second global power rail 104 and the global clock tree 106. The circuit load 212 therefore operates as a globally-powered circuit load of the power domain 108-4. Thus, the collection of digital circuits of the circuit load 212 operates using the second global voltage 114 as well as the current (not explicitly shown) distributed by the second global power rail 104 and using the global clock signal 116 propagated by the global clock tree 106. The circuit load 210, in contrast, is coupled to the local power rail 202 and the local clock tree 206. The circuit load 210 therefore operates as a locally-powered circuit load of the power domain 108-1. Thus, the collection of digital circuits of the circuit load 210 operates using the local voltage 204 as well as the current (not explicitly shown) distributed by the local power rail 202 and using the local clock signal 208 propagated by the local clock tree 206. The local voltage 204 and the local clock signal 208 are determined by the power state controller 110 based on a duty cycle parameter as is described below with reference to FIGS. 3 and 4.

Each circuit load corresponds to at least one block, at least one core, a grouping of circuitry, or a combination thereof that implements some functionality in a power domain 108. Examples of device functionalities include sensor processing, short-range radio processing, security processing, graphics or display processing, modem functionality, storage processing, general compute processing, and combinations thereof. Different power domains may have different performance demands corresponding to different groups of available power states. Further, for a single given device functionality, different circuit loads may be associated with different preferred performance levels, and thus with different appropriate power states and corresponding power domains. In an example with respect to modem functionality, a general-modem-logic circuit load may operate with a power state including a lower voltage level (e.g., the circuit load 212 having a fixed operating point for the power domain 108-4), but a modem-processing-core circuit load may operate with a dynamically-changing power state having a lower voltage level at some times and a higher voltage level at other times, depending on currently-existing utilization demands (e.g., the circuit load 210 having a variable operating point for the power domain 108-1). A memory circuit load for modem functionality, on the contrary, may operate with a power state including a fixed higher voltage level (e.g., analogous to the power domain 108-4 but with the circuit load 212 coupled to the first global power rail 102, instead of being coupled to the second global power rail 104 as shown in FIG. 2).

Different performance demands on circuit loads and blocks thereof can be accommodated using the structures, arrangements, and techniques described herein. For instance, the circuit load 212 as illustrated operates in accordance with a global supply arrangement as part of the power domain 108-4. The circuit load 212 receives the second global voltage 114 and the global clock signal 116 to realize one example power state. Alternatively, although not so illustrated in FIG. 2, the circuit load 212 can receive the second global voltage 114 and be coupled to a local clock tree 206 of another power domain (not explicitly shown) to receive a local clock signal 208 thereof to implement a hybrid arrangement—e.g., partially global and partially local—that realizes another example power state for the other power domain. The power domain 108-4 and the circuit load 212 as depicted in FIG. 2 and described above, including alternatives described herein, are presented for purposes of illustration and to draw a contrast with the power domain 108-1 and the circuit load 210.

The circuit load 210, in contrast, is illustrated as operating in accordance with a local supply arrangement. With the circuit load 210 receiving both the local voltage 204 and the local clock signal 208, the current power state of the circuit load 210 can be adjusted rapidly by the power state controller 110 to enable implementation of a substantially continuously adjustable power consumption level over some timeframe. The power state controller 110 can establish, for example, at least one power state per global power rail (e.g., at least two power states with two global power rails or at least three power states with three global power rails). The substantially continuously adjustable power consumption level is realized by approximating intermediate power states over multiple timeslots of some timeframe in accordance with a duty cycle that is realized such that the timeslot recurs over the timeframe. An example duty cycle is described below with reference to FIG. 3, and examples of different average power consumptions in the context of multiple timeslots of different timeframes is described below with reference to FIG. 5.

Figure 3:
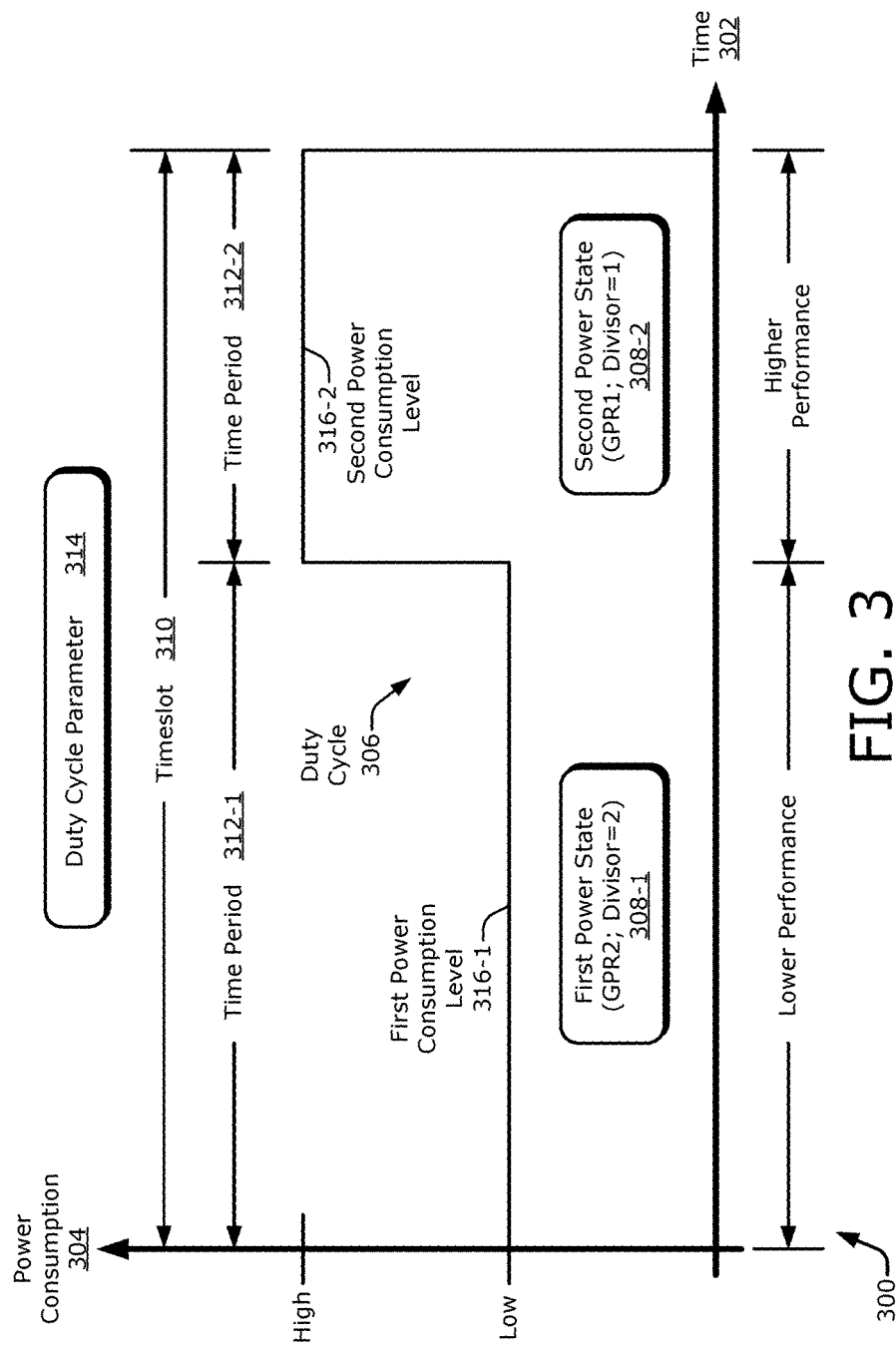
FIG. 3 depicts a graph illustrating an example duty cycle having multiple time periods wherein the duty cycle is indicative of a power consumption pattern instituted by the power state controller.

FIG. 3 depicts a graph 300 illustrating an example duty cycle 306 indicative of a power consumption pattern instituted by the power state controller 110. A duty cycle parameter 314 indicates (e.g., defines, specifies, or describes) how the power state controller 110 is to generate the duty cycle 306 for a given power domain. Thus, the power state controller 110 generates the duty cycle 306 for a power domain in accordance with the duty cycle parameter 314. As shown, the graph 300 has a horizontal abscissa axis (x-axis) representing time 302 and a vertical ordinate axis (y-axis) representing power consumption 304. On the vertical axis for the power consumption 304, a low power consumption level and a high power consumption level are marked.

Figure 5:
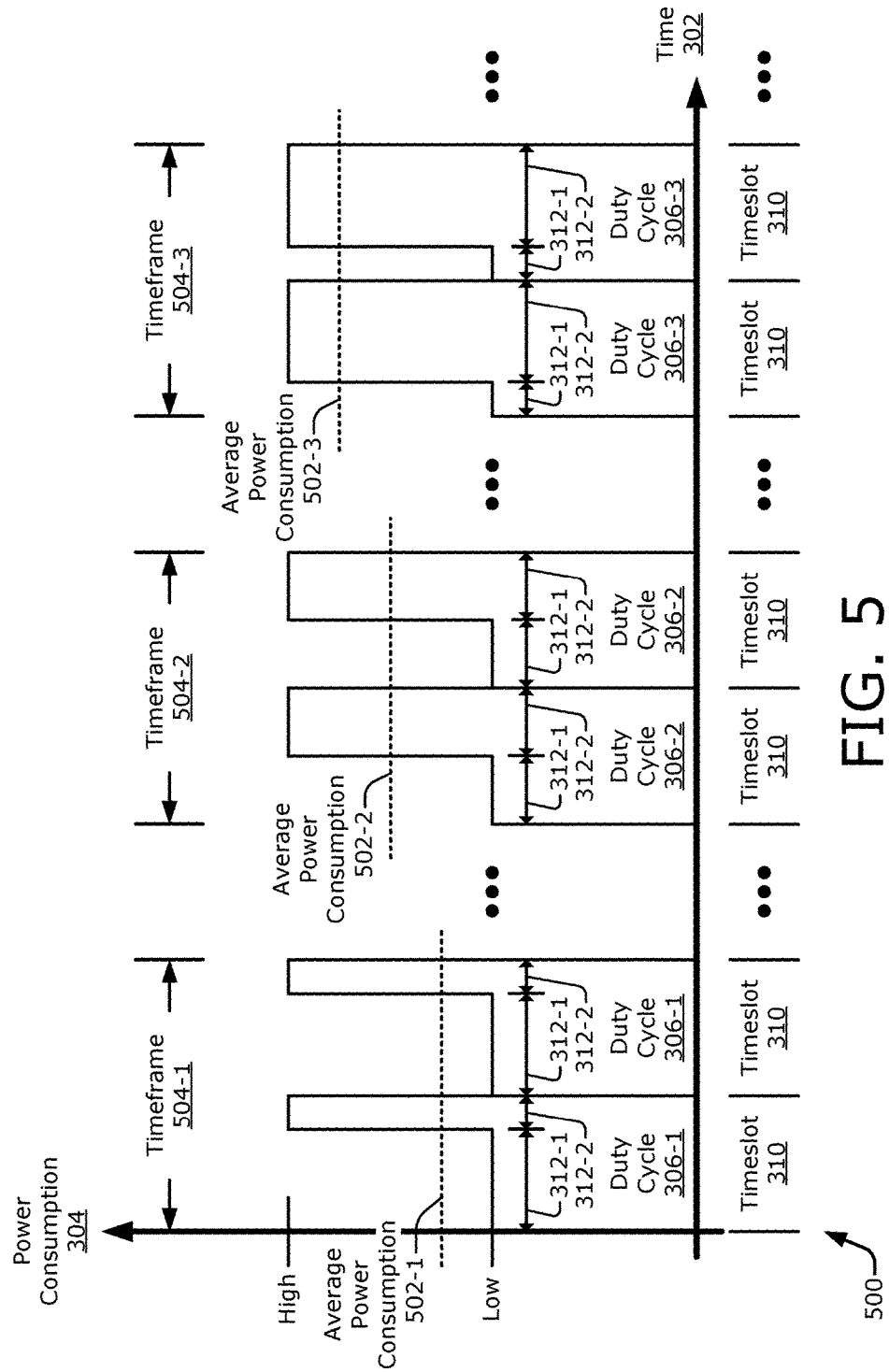
FIG. 5 depicts a graph illustrating an example of the average power consumption variability that can be achieved using time periods of differing durations across multiple different duty cycles.

The duty cycle 306 is illustrated to extend across one timeslot 310 at two different power consumption levels. However, the duty cycle 306 occurs repeatedly over time (e.g., as shown in FIG. 5), so the timeslot 310 is also referred to herein as a recurrent timeslot 310. The timeslot 310 is separated into multiple time periods 312, such as a first time period 312-1 and a second time period 312-2. Each time period 312 occupies some duration of the time 302 along the x-axis. The total of the durations of the multiple time periods 312 can be equivalent to the duration of the timeslot 310, at least if the durations of power state transitions are disregarded or considered part of a corresponding time period 312. Although two time periods 312, e.g. the first time period 312-1 and the second time period 312-2, are depicted in FIG. 3 and described herein, each timeslot 310 may alternatively include more than two time periods 312.

The duty cycle 306 is representative of respective durations of respective time periods 312 or the relative durations of the time periods 312 within a given timeslot 310. In FIG. 3, the duty cycle 306 is representative of a duration of the first time period 312-1 and a duration of the second time period 312-2. This representation may be expressed in terms of a fraction, a percentage, a ratio, a proportionality, or some other indication of relative duration among two or more time periods 312 of a timeslot 310. As used herein, a power state controller 110 can establish power states 308 in accordance with or based on a duty cycle 306. Thus, a duty cycle 306 can correspond to a timeslot 310 having time periods 312 that respectively correspond to power states 308. The duty cycle 306 can therefore refer, for example, to a ratio of a duration of the first time period 312-1 over a duration of the second time period 312-2, a duration of the first time period 312-1 over the sum of the durations of the first time period 312-1 and the second time period 312-2, and so forth.

In example implementations, each respective time period 312 corresponds to a respective power state 308. The power state 308 pertains to a power domain 108, such as the power domain 108-1 having the circuit load 210 of FIG. 2. As shown for the first time period 312-1, the duty cycle 306 indicates that the power domain is to be operated at a relatively lower power level, which is depicted as a first power consumption level 316-1. In contrast, as shown for the second time period 312-2, the duty cycle 306 indicates that the power domain is to be operated at a relatively higher power level, which is depicted as a second power consumption level 316-2. The first time period 312-1 corresponds to a first power state 308-1, and the second time period 312-2 corresponds to a second power state 308-2. The lower power consumption level of the first power state 308-1 can be implemented using, e.g., the second global power rail 104 (GPR2) and a frequency divisor value of two (2) on the global clock signal 116. The higher power consumption level of the second power state 308-2 can be implemented using, e.g., the first global power rail 102 (GPR1) and a frequency divisor value of one (1) on the global clock signal 116. These example power states, as well as circuitry and processes to establish them, are described further below with reference to FIG. 4. Although two different power states 308, e.g. the first power state 308-1 and the second power state 308-2, are depicted in FIG. 3 and described herein, more than two power states 308 may alternatively be established for each timeslot 310. For example, if a timeslot 310 includes three time periods 312, then a different power state 308 of three power states 308 can be respectively associated with each of the three time periods 312.

The duty cycle parameter 314 represents a parameter value that specifies, defines, describes, or otherwise indicates one or more characteristics associated with the duty cycle 306. Examples of duty cycle parameters 314 include a duration of the timeslot 310, an individual duration of a given time period 312, relative or proportional durations of multiple time periods 312, an intended average voltage level, and combinations thereof. A duty cycle parameter 314 can additionally or alternatively specify a parameter for instantiating a power state 308, as is described below. With respect to a duration of a timeslot 310, the duty cycle parameter 314 can be expressed in terms of seconds (e.g., milliseconds), number of clock cycles, and so forth. With respect to a duration of a time period 312, the duty cycle parameter 314 can be expressed in terms of seconds, number of clock cycles, proportionality of durations between two or more time periods 312 (e.g., two parts and three parts), respective percentage of the duration of the timeslot 310 for a respective time period 312 (e.g., 60% for the second time period 312-2), some combination thereof, and so forth.

While a power domain 108 is in the first power state 308-1 of the first time period 312-1, the power domain 108 is operating at a relatively lower power consumption and lower performance mode. While a power domain 108 is in the second power state 308-2 of the second time period 312-2, the power domain 108 is operating at a relatively higher power consumption and higher performance mode. These two power states 308 operate at two discrete power consumption levels that are depicted as low and high with a resulting average power consumption level (not shown in FIG. 3) that is dependent on the relative durations of the multiple time periods 312. However, because the relative durations of the multiple time periods 312 can be adjusted quickly and with low energy cost, an almost continuous range of average power consumption levels can be achieved over multiple timeframes, each of which includes multiple timeslots 310. Average power consumption levels over different timeframes are described below with reference to FIG. 5.

Figure 4:
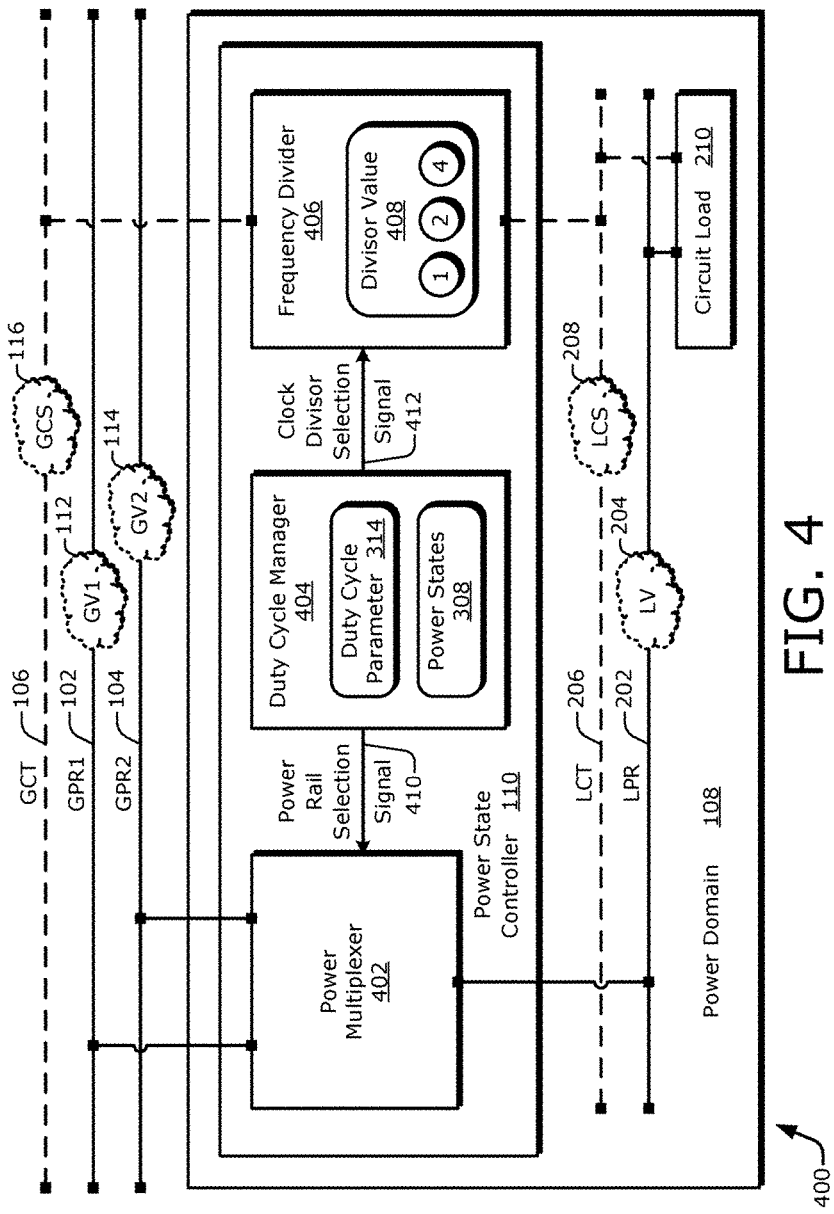
FIG. 4 illustrates an example power state controller that is configured to establish multiple different power states for a power domain in accordance with a duty cycle using a duty cycle manager.

FIG. 4 illustrates an example power state controller 110 that is configured to establish multiple different power states 308 for the power domain 108 in accordance with a duty cycle parameter 314 to generate a duty cycle 306. The power state controller 110 includes a power multiplexer 402, a duty cycle manager 404, and a frequency divider 406. As described above with reference to FIG. 3, a duty cycle parameter 314 indicates when a particular power state 308 is to be in effect to realize a corresponding duty cycle 306. Generally, the duty cycle manager 404 establishes power states 308 by managing the power multiplexer 402 and the frequency divider 406 in accordance with the duty cycle parameter 314 to generate the duty cycle 306. More specifically, the duty cycle manager 404 manages a timing of adjustments of a power state 308 of a circuit load 210 based on respective durations of respective time periods 312 of multiple time periods of a timeslot 310 corresponding to a duty cycle that is currently in effect, with each respective time period 312 corresponding to a respective power state 308 of multiple power states.

The power state controller 110 functions as a bridge between the global supply lines of the integrated circuit 100 and the local supply lines of the power domain 108. The power state controller 110 uses the first global voltage 112 or the second global voltage 114 and the global clock signal 116 to establish multiple power states 308. Generally, the power state controller 110 can establish at least one power state 308 per global power rail (e.g., at least two power states with two global power rails or at least four power states with four global power rails). Thus, the power state controller 110 establishes the multiple power states 308 via the local power rail 202 with the local voltage 204 and via the local clock tree 206 with the local clock signal 208. To do so, the duty cycle manager 404 of the power state controller 110 issues a power rail selection signal 410 to the power multiplexer 402 and a clock divisor selection signal 412 to the frequency divider 406.

The power multiplexer 402 is coupled to the first global power rail 102 and the second global power rail 104, which are external to the power domain 108. The power multiplexer 402 is coupled to the local power rail 202, which is internal to the power domain 108. The power multiplexer 402 connects a selected global power rail, e.g., the first global power rail 102 or the second global power rail 104, to the local power rail 202. In other words, the power multiplexer 402 is configured to select from among at least the first global power rail 102 or the second global power rail 104 for connection to the local power rail 202 based on the power rail selection signal 410. As used herein, the phrase "selecting from among" or "selecting from among at least" refers to or implies the selecting of an item from a group having two or more items, including from among three items, from among four items, and so forth. Additionally, as used herein, the term "between" can pertain to two items or to more than two items (e.g., be applied to two power states, three power states, or four power states).

If the local power rail 202 is connected to the first global power rail 102, the local voltage 204 corresponds to the first global voltage 112. If, on the other hand, the local power rail 202 is connected to the second global power rail 104, the local voltage 204 corresponds to the second global voltage 114. Thus, the circuit load 210 can receive a voltage level from the first global power rail 102 or the second global power rail 104 depending on which global power rail of two or more global power rails is currently selected for connection to the local power rail 202. Example implementations for a power multiplexer 402 are described herein below with reference to FIG. 10.

The frequency divider 406 is coupled to the global clock tree 106 externally of the power domain 108 and coupled to the local clock tree 206 internally to the power domain 108. The frequency divider 406 divides a frequency value of the global clock signal 116 by a divisor value 408. The frequency divider 406 is configured to divide the frequency value of the global clock signal 116 by a divisor value 408 that is selected from a group of divisor values. By dividing a frequency value of the global clock signal 116 to produce the local clock signal 208 on the local clock tree 206, the frequency divider 406 can maintain or lower the frequency value of the global clock signal 116 as the frequency value for the local clock signal 208. An example group of the divisor values includes powers of two. Thus, the divisor value 408 can be implemented as, for example, one of the powers of two (e.g., $2^0=1$, $2^1=2$, $2^2=4$, and $2^3=8$). If a respective power of two is used as a selected divisor value 408 across respective ones of the multiple power domains 108, synchronous communication 118 (of FIG. 1) between different power domains 108 is facilitated. Example implementations relating to inter-domain synchronous communication 118 are described herein below with reference to FIGS. 8 and 9.

If the divisor value 408 is set to "1," the frequency divider 406 can pass the global clock signal 116 unchanged, at least in terms of frequency, such that the frequency value of the local clock signal 208 is the same as that of the global clock signal 116. If the divisor value 408 is set to "2," the frequency divider 406 changes the global clock signal 116 such that the frequency value of the local clock signal 208 is half that of the global clock signal 116. And if the divisor value 408 is set to "4," the frequency divider 406 changes the global clock signal 116 such that the frequency value of the local clock signal 208 is one-quarter that of the global clock signal 116. Thus, using the frequency divider 406, the power state controller 110 can provide to the circuit load 210 a local clock signal 208 having a frequency level that is the same as or is lower than that of the global clock signal 116.

The duty cycle manager 404 manages the power multiplexer 402 and the frequency divider 406 by sending a signal to effect a different power state 308 based on a duration of a time period 312 indicated by the duty cycle parameter 314 for a duty cycle 306. In an example implementation, the duty cycle manager 404 establishes one of two different power states 308, which are shown below in Table 1.

TABLE 1

Examples of power states 308.

| First Power State 308-1 | Second Power State 308-2 |
| --- | --- |
| Relatively Lower Performance | Relatively Higher Performance |
| Lower Supply Voltage Level = Second Global Power Rail 104 (GPR2) | Higher Supply Voltage Level = First Global Power Rail 102 (GPR1) |
| Lower Clock Frequency = Divisor Value 408 of "2" (2) | Higher Clock Frequency = Divisor Value 408 of "1" (1) |

In Table 1, the first power state 308-1 represents an example of a relatively lower power consumption/lower performance power state, and the second power state 308-2 represents an example of a relatively higher power consumption/higher performance power state.

In operation, the duty cycle manager 404 causes the power multiplexer 402 to connect a selected global power rail to the local power rail 202 via the power rail selection signal 410. At the conclusion of the first time period 312-1 of FIG. 3, the duty cycle manager 404 instructs the power multiplexer 402 to connect the first global power rail 102 to the local power rail 202 to implement the voltage portion of the second power state 308-2 for the second time period 312-2 of a current timeslot 310. At the conclusion of the second time period 312-2, the duty cycle manager 404 instructs the power multiplexer 402 to connect the second global power rail 104 to the local power rail 202 to implement the voltage portion of the first power state 308-1 for the first time period 312-1 of a subsequent timeslot 310.

The duty cycle manager 404 also causes the frequency divider 406 to divide a frequency value of the global clock signal 116 by a selected divisor value 408 via the clock divisor selection signal 412. At the conclusion of the first time period 312-1, the duty cycle manager 404 instructs the frequency divider 406 to divide the global clock signal 116 by a divisor value 408 of "1" to produce the local clock signal 208 with a same frequency value as the global clock signal 116. This implements the clock signal portion of the second power state 308-2 for the second time period 312-2 of a current timeslot 310. At the conclusion of the second time period 312-2, the duty cycle manager 404 instructs the frequency divider 406 to divide the global clock signal 116 by a divisor value 408 of "2" to produce the local clock signal 208 with a halved frequency value as compared to that of the global clock signal 116. This implements the clock signal portion of the first power state 308-1 for the first time period 312-1 of a subsequent timeslot 310. The effects of sequential occurrences of timeslots 310 to effect a given duty cycle 306 are discussed below with reference to FIG. 5.

FIG. 5 depicts a graph 500 illustrating an example of average power consumption variability that can be achieved using time periods 312 of differing durations thereby providing timeslots 310 having different duty cycles 306, such as a duty cycle 306-1, a duty cycle 306-2, or a duty cycle 306-3. The graph 500 depicts time 302 along the x-axis versus power consumption 304 along the y-axis. On the vertical axis for the power consumption 304, a low power consumption level and a high power consumption level are marked. On the horizontal axis for the time 302, multiple timeslots 310 are marked, with each timeslot having the same duration. Multiple timeslots 310 that elapse over the time 302 can be grouped into timeframes 504 based on the relative durations of the time periods 312. In the graph 500, three different timeframes with three different respective duty cycles are shown: a timeframe 504-1 with multiple duty cycles 306-1, a timeframe 504-2 with multiple duty cycles 306-2, and a timeframe 504-3 with multiple duty cycles 306-3.

In the illustrated example, each duty cycle 306 corresponds to a timeslot 310. Each of the timeslots 310 has the same duration. However, the different time periods 312 that are internal to each timeslot 310 can have different durations with respect to each other within a corresponding timeframe 504 so as to enable the average power consumption over a corresponding timeframe 504 to be changed in different timeframes 504. Each time slot 310 includes an earlier or first time period 312-1 and a later or second time period 312-2. The power consumption of each first time period 312-1 is at the low power consumption level, and the power consumption of each second time period 312-2 is at the high power consumption level. The respective durations of the first time periods 312-1 and the second time periods 312-2 are constant within a given timeframe 504, but the durations may be different for each timeframe 504. In other words, the corresponding duty cycle 306 can be altered in different manners by changing the relative durations of the time periods 312 between different consecutive timeframes 504. Consequently, each timeframe 504 may correspond to a different average power consumption 502.

In the first timeframe 504-1, the first time period 312-1 in each time slot 310 occupies 75% of the timeslot 310, and the second time period 312-2 occupies 25% of the timeslot 310. The resulting duty cycle 306-1 creates an average power consumption 502-1 over the timeframe 504-1 that is 25% above the low power consumption level for this example. In the second timeframe 504-2, the first time period 312-1 in each time slot 310 occupies 50% of the timeslot 310, and the second time period 312-2 also occupies 50% of the timeslot 310. The resulting duty cycle 306-2 creates an average power consumption 502-2 over the second timeframe 504-2 that is 50% above the low power consumption level, or midway between the low and high power consumption levels. In the third timeframe 504-3, the first time period 312-1 in each time slot 310 occupies 25% of the timeslot 310, and the second time period 312-2 occupies 75% of the timeslot 310. The resulting duty cycle 306-3 creates an average power consumption 502-3 over the third timeframe 504-3 that is 75% above the low power consumption level or 25% below the higher power consumption level. The changes in 25% increments between the lengths of the first time periods 312-1 and the second time periods 312-2 in different timeframes 504 is an example incremental amount, for changes may be made in other alternative incremental amounts.

The relative durations of the time periods 312 can be changed at a finer granularity between timeframes 504 because the voltage and frequency adjustments can be performed quickly by the power state controller 110 using the power multiplexer 402 and the frequency divider 406 of FIG. 4. The average power consumption 502 also relates to an energy efficiency at which a circuit load is being operated over time. Generally, energy efficiency can be greater if power is not being consumed unnecessarily. If average power consumption is lowered by switching power states so as to just meet or slightly exceed average performance demands, the amount of power that is wasted can be reduced. Thus, instead of spending too much time at an unnecessarily high performance level, the average operational energy efficiency can be increased by switching power states at a granularity that is substantially continuous between the low power consumption level with a corresponding lower performance and the high power consumption level with a corresponding higher performance. This power state switching can be performed so as to just satisfy an average performance level that currently exists.

Digital logic circuitry, in contrast with analog circuitry, is designed to intrinsically have and use discrete values to promote certainty in the operation thereof. The values of the local voltage levels and the local clock signal frequencies are discrete. Hence, there are a finite number of available power states within a given power domain and a corresponding finite number of instantaneous power consumption levels, with the granularity between two adjacent power states ultimately constrained by the precision of a timing function used to track an elapsed duration of each time period 312. However, over time, these finite number of instantaneous power consumption levels can provide a multitude of average power consumption levels if the relative proportions of time in which a circuit load is operating at two or more of the finite power consumption levels are changed. Thus, by changing the relative durations of time periods 312 in which respective discrete power consumption levels are in effect based on a duty cycle parameter 314 for a duty cycle 306, a substantially continuous range of power consumption levels can be achieved.

Figure 6:
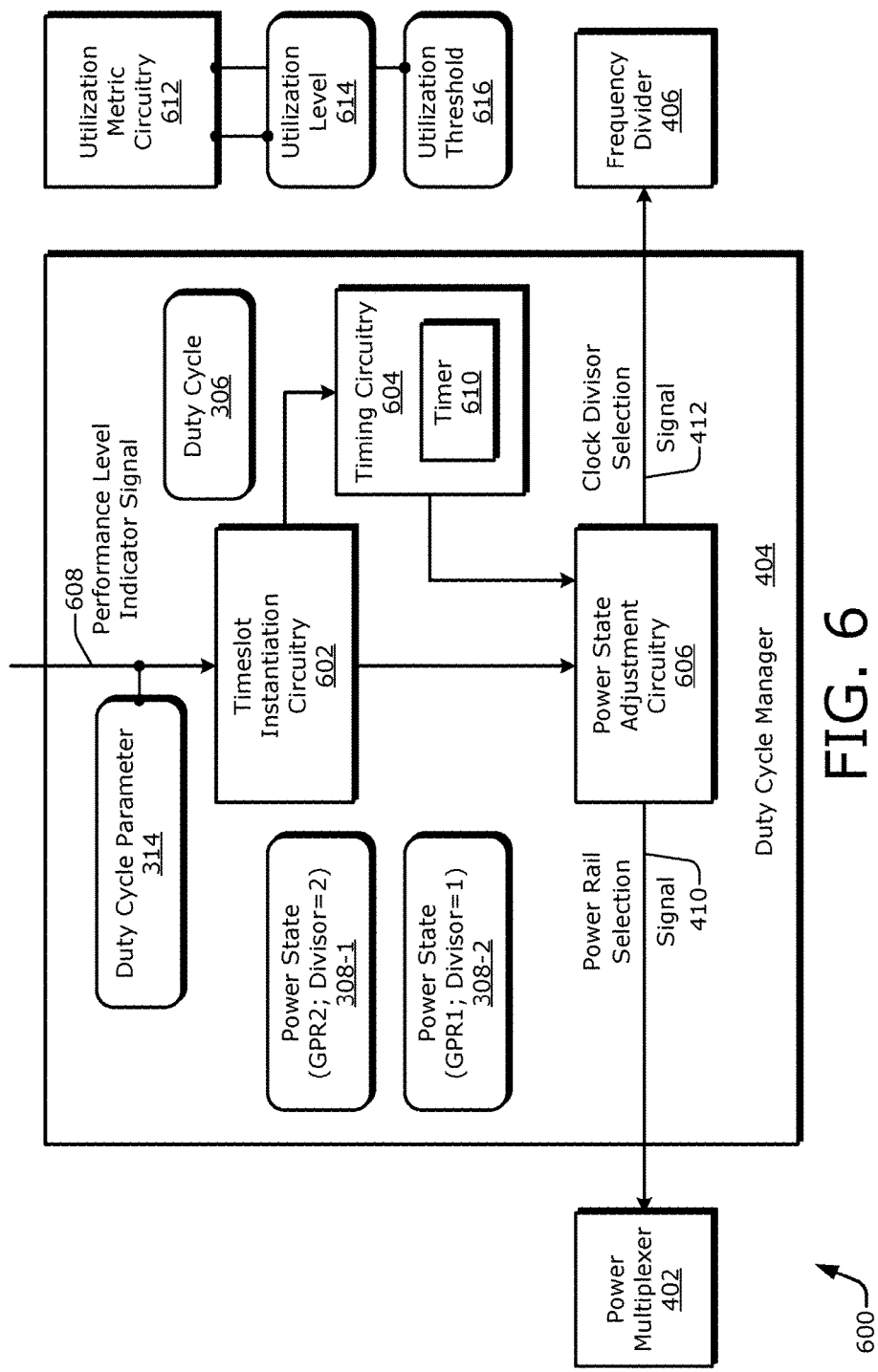
FIG. 6 illustrates an example duty cycle manager that includes timeslot instantiation circuitry and power state adjustment circuitry.

FIG. 6 illustrates generally at 600 an example duty cycle manager 404 that communicates with the power multiplexer 402 and the frequency divider 406 of a power state controller 110 (e.g., of FIGS. 1, 2, and 4). FIG. 6 also includes utilization metric circuitry 612. As illustrated, the duty cycle manager 404 includes timeslot instantiation circuitry 602, timing circuitry 604, and power state adjustment circuitry 606. The timing circuitry 604 includes at least one timer 610. The duty cycle manager 404 includes or otherwise has access to characteristics of one or more power states 308, such as the first power state 308-1 and the second power state 308-2. Example characteristics of power states 308 are set forth herein above at Table 1 and can include a voltage level, a global power rail, a divisor value, a combination thereof, and so forth. The duty cycle manager 404 also includes, receives, or otherwise has access to a duty cycle parameter 314 that provides characteristics of at least one duty cycle 306. In operation, the duty cycle parameter 314 provides characteristics for one duty cycle 306 for one timeframe 504 (of FIG. 5) and subsequently provides characteristics for another duty cycle 306 for another timeframe 504. Examples of duty cycle characteristics include two or more time periods 312 or the durations thereof, a length of a timeslot 310, a power state corresponding to each time period 312, or a combination thereof.

The duty cycle manager 404 receives a performance level indicator signal 608 that includes the duty cycle parameter 314. In some implementations, the duty cycle manager 404 receives the performance level indicator signal 608 from software or firmware that is executing on or controlling the operation of at least a portion of the underlying integrated circuit, such as the software 128 of FIG. 1. For example, modem firmware can send the performance level indicator signal 608 to the duty cycle manager 404 for a power domain 108 corresponding to modem circuitry. In other implementations, the duty cycle manager 404 receives the performance level indicator signal 608 from the utilization metric circuitry 612. The utilization metric circuitry 612 monitors a block of circuitry, such as the circuit load 210 of FIG. 2, to detect a current utilization level 614, which can be quantified as a utilization metric. In operation, the utilization metric circuitry 612 compares the utilization level 614 to at least one utilization threshold 616, such as an upper or a lower threshold. If the detected current utilization level 614 exceeds an upper utilization threshold 616, the utilization metric circuitry 612 can issue a performance level indicator signal 608 having a duty cycle parameter 314 that increases an average performance level and increases average power consumption. On the other hand, if the detected current utilization level 614 falls below a lower utilization threshold 616, the utilization metric circuitry 612 can issue a performance level indicator signal 608 having a duty cycle parameter 314 that decreases an average performance level and decreases average power consumption.

In an example operation for the duty cycle manager 404, the timeslot instantiation circuitry 602 instantiates a timeslot 310 that comports with the duty cycle parameter 314 to realize the duty cycle 306. Thus, the timeslot instantiation circuitry 602 can adjust a length of a timeslot 310, change respective durations of respective time periods 312, and so forth. Consider an example situation in which the duty cycle parameter 314 specifies a 100 microsecond timeslot 310 in which a first time period 312-1 corresponding to the first power state 308-1 is allocated 40% of the time and the second time period 312-2 corresponding to the second power state 308-2 is allocated the remaining time. The timeslot instantiation circuitry 602 sets up one timer 610 for 40 microseconds and another timer 610 for 60 microseconds. These times may alternatively be set up sequentially if one timer 610 is used.

The timeslot instantiation circuitry 602 also indicates to the power state adjustment circuitry 606 which power state 308 corresponds to which timing for the power state adjustments. The timing circuitry 604 tracks the timer 610 and alerts the power state adjustment circuitry 606 at the expiration of the timer 610 so as to establish a recurrent timing at which operation of a corresponding power domain can be adjusted from one power state to another power state (e.g., between a higher performance power state and a lower performance power state, or vice versa) across multiple timeslots 310 in accordance with the duty cycle 306. Thus, responsive to expiration of the timer 610, the power state adjustment circuitry 606 is triggered to provide respective signals to the power multiplexer 402 and the frequency divider 406. Based on the respective signals provided by the power state adjustment circuitry 606, the power multiplexer 402 adjusts the voltage or the frequency divider 406 adjusts the frequency so as to establish the next power state 308. For example, if the timer expiration is indicative of a transition from the first power state 308-1 to the second power state 308-2, the power state adjustment circuitry 606 provides the following signals: The power state adjustment circuitry 606 sends the power rail selection signal 410, which is indicative of the first global power rail 102 (GPR1), to the power multiplexer 402. The power state adjustment circuitry 606 also sends the clock divisor selection signal 412, which is indicative of a divisor value 408 of "1" (1), to the frequency divider 406.

Figure 7:
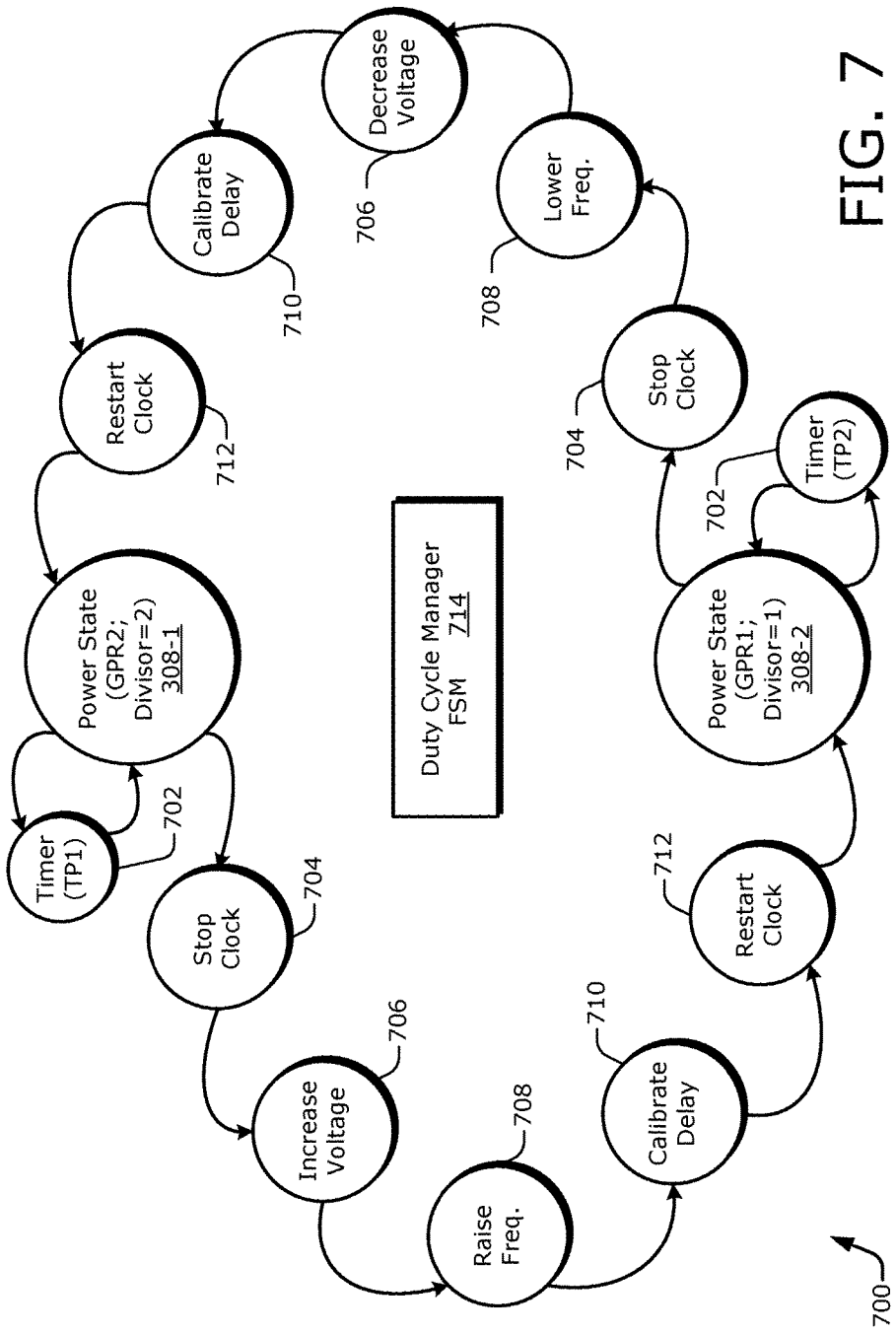
FIG. 7 illustrates an example state diagram for a finite state machine implementation of a duty cycle manager.

FIG. 7 illustrates an example state diagram 700 for a finite state machine (FSM) implementation of the duty cycle manager 404 (e.g., of FIG. 6), which is referred to as a duty cycle manager finite state machine 714. The state diagram 700 includes two power states 308 and 12 transitional states 702-712. More specifically, the two power states 308 include: the first power state 308-1 and the second power state 308-2. The 12 transitional states include: two timer states 702, two clock cessation states 704, two voltage adjustment states 706, two frequency adjustment states 708, two calibration states 710, and two clock engagement states 712.

The state diagram 700 is described starting with the first power state 308-1 and proceeding in a counter-clockwise direction. At the timer state 702, a first timer (TP1) for a first time period 312-1 counts down elapsed time. At the expiration of the first timer, an exiting from the first power state 308-1 is triggered. Proceeding counter-clockwise, at the clock cessation state 704, the pulses of the local clock signal 208 are stopped from reaching (e.g., gated from) the circuit load 210. At the voltage adjustment state 706, the voltage level is increased. For example, the power state adjustment circuitry 606 can cause the power multiplexer 402 to switch from coupling the second global power rail 104 to the local power rail 202 to coupling the first global power rail 102 to the local power rail 202. An example of power multiplexing circuitry configured to perform a power-multiplexing operation is described herein below with reference to FIG. 10.

At the frequency adjustment state 708, the frequency of the local clock signal 208 is raised. For example, the power state adjustment circuitry 606 can cause the frequency divider 406 to switch from applying a divisor value 408 of "2" to applying a divisor value 408 of "1." At the calibration state 710, resumption of processing for the circuit load 210 is delayed while the local clock signal 208 is calibrated to be aligned with the global clock signal 116 so as to facilitate synchronous communication 118. Calibration schemes and circuitry are described herein below with reference to FIGS. 8 and 9. At the clock engagement state 712, the local clock signal 208 is restarted and again provided to the circuit load 210 to resume logical operations. After the clock is restarted, the state diagram 700 enters the second power state 308-2.

The state diagram 700 is further described continuing with the second power state 308-2 and proceeding in a counter-clockwise direction. At the timer state 702, a second timer (TP2) for a second time period 312-2 counts down elapsed time. At the expiration of the second timer, an exiting from the second power state 308-2 is triggered. Continuing counter-clockwise, at the clock cessation state 704, the pulses of the local clock signal 208 are gated from the circuit load 210. At the frequency adjustment state 708, the frequency of the local clock signal 208 is lowered. For example, the power state adjustment circuitry 606 can cause the frequency divider 406 to switch from applying a divisor value 408 of "1" to applying a divisor value 408 of "2."

At the voltage adjustment state 706, the voltage level is decreased. For example, the power state adjustment circuitry 606 can cause the power multiplexer 402 to switch from coupling the first global power rail 102 to the local power rail 202 to coupling the second global power rail 104 to the local power rail 202. At the calibration state 710, resumption of processing for the circuit load 210 is delayed while the local clock signal 208 is again calibrated to be aligned with the global clock signal 116 so as to facilitate the synchronous communication 118. At the clock engagement state 712, the local clock signal 208 is provided to the circuit load 210 to resume logical operations. After the clock is restarted, the state diagram 700 again enters the first power state 308-1.

Figure 8:
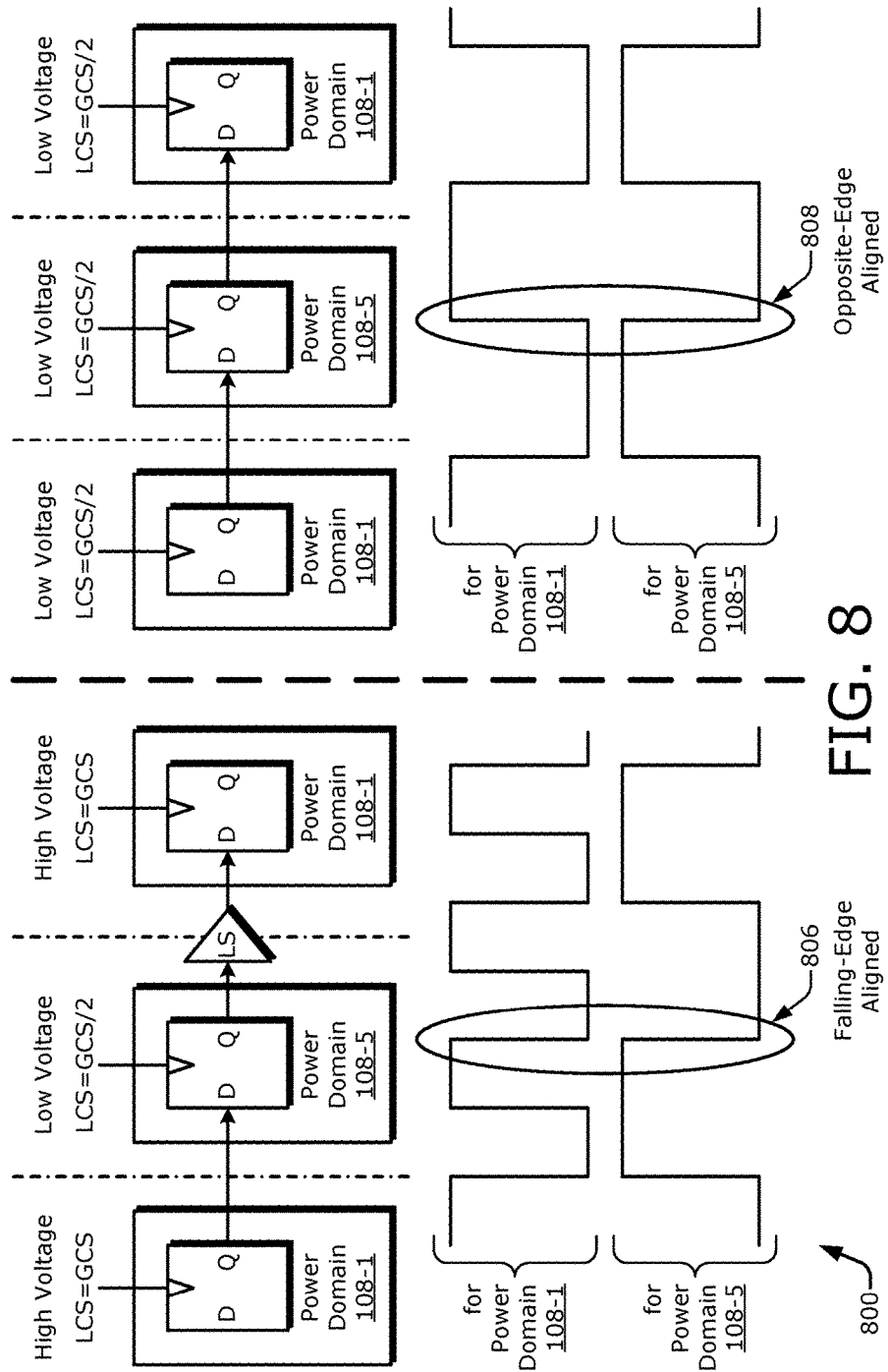
FIG. 8 illustrates an example scheme for inter-power domain synchronous communication.

FIG. 8 illustrates an example scheme 800 for inter-power domain synchronous communication. The scheme 800 as illustrated is divided by a thick dashed line into a left side and a right side. A power domain 108-1 and a power domain 108-5 are depicted on both sides. By way of example, a "d" flip-flop is shown to be operating in the power domain 108-1 and the power domain 108-5. From left-to-right on each side, synchronous communication proceeds from the power domain 108-1, to the power domain 108-5, and then back to the power domain 108-1. In other words, the power domain 108-1 is depicted twice on each side of the scheme 800 to represent a power domain from which the power domain 108-5 receives a communication and the same power domain again to which the power domain 108-5 provides a communication. Inter-power domain communication is represented by solid arrows that cross the dotted-and-dashed lines separating the power domain 108-1 from the power domain 108-5 on both sides.

In an example scenario, the power domain 108-1 includes a power state controller 110 as shown in FIG. 2 and therefore can adjust power states thereof, but the power domain 108-5 is like the power domain 108-4 in FIG. 2 and therefore cannot adjust a power state thereof. However, in other implementations, both the origination power domain and the destination power domain may be capable of adjusting power states. On both sides of the scheme 800, the power domain 108-5 is operating with a low voltage level and a frequency of the local clock signal that is half that of the global clock signal (LCS=GCS/2). On the right side, the power domain 108-1 is also operating with a low voltage level and a frequency of the local clock signal that is half that of the global clock signal (LCS=GCS/2). But on the left side, the power domain 108-1 is operating with a high voltage level and a frequency of the local clock signal that is equal to that of the global clock signal (LCS=GCS). Waveforms representing these relative clock frequencies for the power domain 108-1 and the power domain 108-5 are depicted in the lower portion of FIG. 8 for both sides of the scheme 800.

Accordingly, with respect to the voltage differences, a voltage level shifter (LS) is deployed on the left side of the scheme 800 between the power domain 108-5 and the right instance of the power domain 108-1 because signals originate from a relatively lower-voltage power domain and are sent to a relatively higher-voltage power domain. With respect to clock frequency differences, in some example implementations, each frequency is a multiple of another frequency by a power of two. Synchronous communication can therefore be enabled by appropriately aligning the edges of different clock signals, as is described below.

The alignment of the edges of two or more clock signals can include alignment along falling edges, rising edges, or opposite edges. Edge alignment is established, for example, such that a destination power domain is provided an amount of time equal to at least a half of a cycle in the destination power domain between when data is provided by a source power domain and when the data is to be latched by the destination power domain. Thus, for the left side of the scheme 800 in which the power domain 108-1 has a different clock frequency (e.g., a different frequency value) than the power domain 108-5, the clock signals are phase shifted so as to be falling-edge aligned, as indicated by the ellipse 806. For the right side of the scheme 800 in which the power domain 108-1 and the power domain 108-5 have the same clock frequency (e.g., a same frequency value), the clock signals are phase shifted so as to be opposite-edge aligned, as indicated by the ellipse 808. An example of phase adjustment circuitry to accomplish clock signal alignment is described below with reference to FIG. 9.

Figure 9:
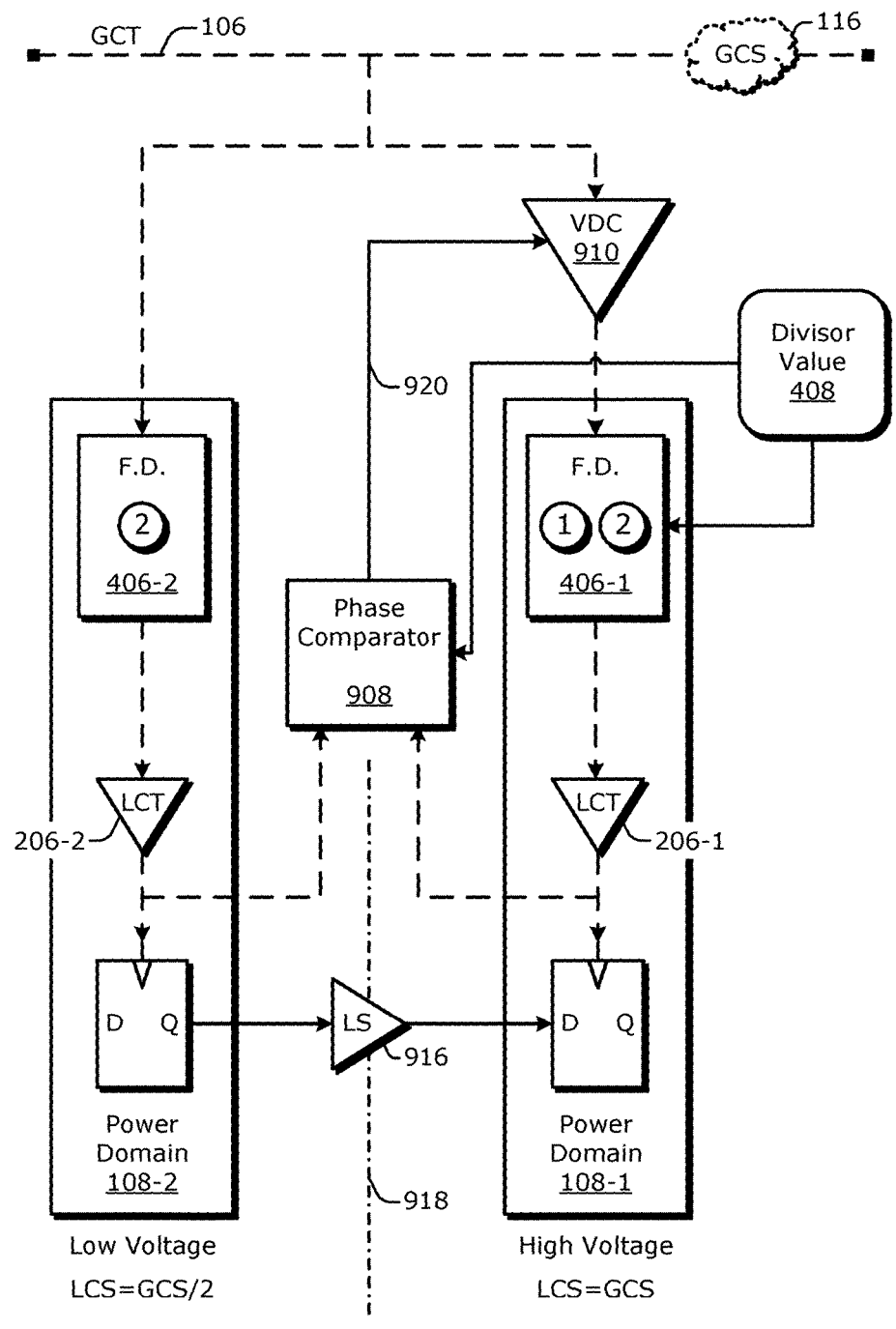
FIG. 9 illustrates an example of phase adjustment circuitry to facilitate the inter-power domain synchronous communication of FIG. 8.

FIG. 9 illustrates an example of phase adjustment circuitry 900 to realize the inter-power domain synchronous communication of FIG. 8. A second power domain 108-2 and a first power domain 108-1 are communicating across a power domain boundary 918. The second power domain 108-2 is operating with a low voltage level and a frequency of the local clock signal that is half that of the global clock signal (LCS=GCS/2). The first power domain 108-1 is operating with a high voltage level and a frequency of the local clock signal that is equal to that of the global clock signal (LCS=GCS).

Generally, multiple power domains (e.g., the first power domain 108-1 and the second power domain 108-2) are configured to facilitate inter-domain communication by compensating for a first power state being different from a second power state using the phase adjustment circuitry 900 or a level shifter 916. The level shifter 916 increases the voltage for a data signal propagating from the relatively lower-voltage power domain 108-2 to the relatively higher-voltage power domain 108-1. Operation of the level shifter 916 can be based on a voltage level signal (not shown) from at least one of the first power domain 108-1 or the second power domain 108-2. The voltage level signal is indicative of at least a relative voltage level between local power rails. If a power domain that is a destination for a data signal has a higher voltage level than a power domain that is a source of the data signal, the level shifter 916 is commanded to boost the voltage of the data signal to facilitate inter-domain propagation of the data signal.

The phase adjustment circuitry 900 aligns a local clock signal of the second power domain 108-2 with a local clock signal of the first power domain 108-1. As depicted at the top of FIG. 9, the global clock tree 106 propagates the global clock signal 116. Each of the power domains 108-1 and 108-2 ultimately operate with some version of the global clock signal 116. From left-to-right, each power domain 108-2 and 108-1 is associated with a respective frequency divider 406-2 and 406-1. Each power domain 108-2 and 108-1 is also associated with a respective local clock tree 206-2 and 206-1 that distributes respective local clock signals (e.g., as shown in FIGS. 2 and 4). Although certain components—such as a phase comparator 908 and a variable delay cell 910 (VDC)—are depicted as being external to the power domains 108-2 and 108-1, such circuit components can alternatively be disposed within, or may be logically functioning as part of, the second power domain 108-2 or the first power domain 108-1.

For the second power domain 108-2, the global clock signal 116 is routed through the frequency divider 406-2 and the local clock tree 206-2. Here, the frequency divider 406-2 is set to a divisor value of "2." The global clock signal 116 is also routed through the variable delay cell 910, the frequency divider 406-1, and the local clock tree 206-1 for the first power domain 108-1. The frequency divider 406-1 can operate using a divisor value of "1" or "2." However, these particular divisor values serve as examples for a given frequency divider 406; in other implementations, the frequency divider 406-1 or the frequency divider 406-2 can use different divisor values. The phase adjustment circuitry includes at least the variable delay cell 910 and the phase comparator 908. Both of the phase comparator 908 and the frequency divider 406-1 receive the divisor value 408 that is currently in effect. The currently-selected divisor value 408 determines whether the frequency divider 406-1 halves the global clock signal 116 or passes the global clock signal 116 through to the local clock tree 206-1 with an unchanged frequency.

Generally, the phase adjustment circuitry 900 operates to align at least one of the local clock signals with the other local clock signal or with the global clock signal 116. The phase comparator 908 is coupled to the first local clock signal propagated by the first local clock tree 206-1 and the second local clock signal propagated by the second local clock tree 206-2. The phase comparator 908 outputs a delay control signal 920 based on a first phase of the first local clock signal and a second phase of the second local clock signal. The variable delay cell 910 is coupled to the delay control signal 920 and the global clock signal 116 of the global clock tree 106. The variable delay cell 910 delays the global clock signal 116 based on the delay control signal 920 to align the clock edges.

More specifically, the phase comparator 908 receives the local clock signals from the local clock tree 206-2 and the local clock tree 206-1. The phase comparator 908 uses the divisor value 408 to determine if the two local clock signals are to be falling-edge aligned (e.g., as indicated by the ellipse 806 in FIG. 8) or opposite-edge aligned (e.g., ellipse 808), as described above with reference to FIG. 8. If, for example, the divisor value 408 is "1," the second power domain 108-2 and the first power domain 108-1 have different frequencies. Consequently, the local clock signals are to be falling-edge aligned, as indicated by the ellipse 806. The phase comparator 908 compares the phases of the two local clock signals and sends the delay control signal 920 to the variable delay cell 910 based on the comparison. Responsive to the delay control signal 920, the variable delay cell 910 increases or decreases a delay of the global clock signal 116 being fed to the frequency divider 406-1. This feedback loop continues until the two local clock signals have edges that are aligned appropriately, and the phase comparator 908 changes the delay control signal 920 such that the variable delay cell 910 does not change the delay of the global clock signal 116 any further.

Figure 10:
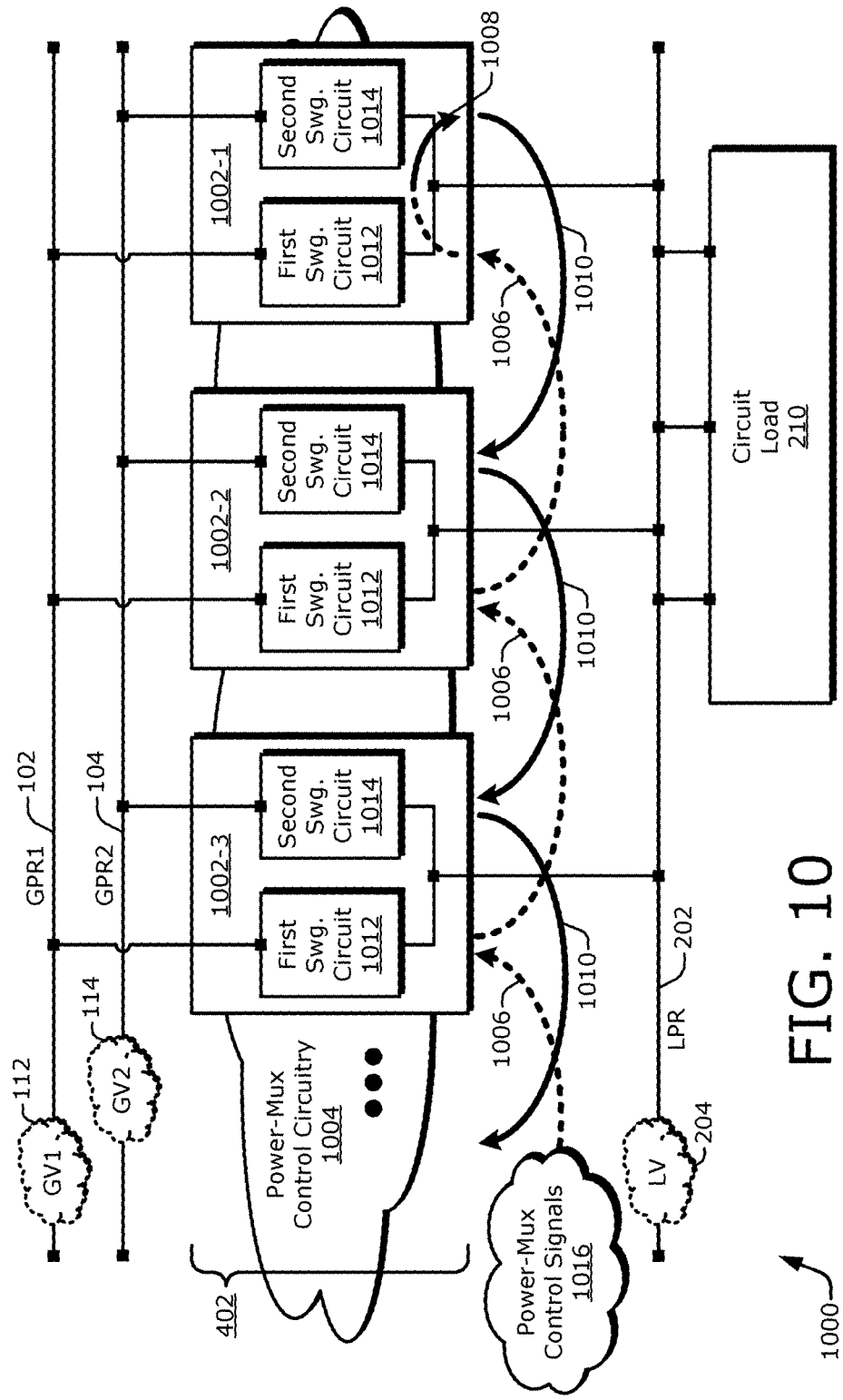
FIG. 10 illustrates an example power multiplexer for a power state controller that is configured to multiplex different global power rails to a local power rail.

FIG. 10 illustrates generally at 1000 an example power multiplexer 402 for a power state controller 110 (e.g., of FIG. 4) that is configured to multiplex different global power rails to a local power rail 202. In addition to the power multiplexer 402, FIG. 10 includes the first global power rail 102, the second global power rail 104, the local power rail 202, and the circuit load 210. From a large scale perspective, the power multiplexer 402 multiplexes a power source for the circuit load 210 by changing from coupling the first global power rail 102 to the local power rail 202 to coupling the second global power rail 104 to the local power rail 202, or vice versa. This enables the local voltage 204, which supplies the circuit load 210 with power, to be set as, or to take on the value of, the first global voltage 112 or the second global voltage 114.

The power multiplexer 402 includes an arrangement of multiple power-multiplexer tiles 1002, along with power-multiplexer control circuitry 1004 (power-mux control circuitry) and power-multiplexer control signals 1016 (power-mux control signals). Three power-multiplexer tiles 1002-1, 1002-2, and 1002-3 are explicitly shown and are depicted as being organized into a chained arrangement of power-multiplexer tiles 1002. Each power-multiplexer tile 1002 is coupled to the first global power rail 102 and to the second global power rail 104. Each power-multiplexer tile 1002 is further coupled to the local power rail 202, and the local power rail 202 is in turn coupled to the circuit load 210. Although the circuit load 210 is shown as being coupled to the local power rail 202 in three specific places, the circuit load 210 can actually be distributed along the chained arrangement of power-multiplexer tiles 1002 to facilitate a more even distribution of current as the power-multiplexing operation is performed.

In operation generally, each power-multiplexer tile 1002 is configured to switch from using the first global power rail 102 to using the second global power rail 104 to supply power to the circuit load 210 via the local power rail 202. To do so, the power-multiplexer control circuitry 1004 sequentially activates the multiple power-multiplexer tiles 1002-3, 1002-2, and 1002-1 to disconnect the first global power rail 102 from, and to connect the second global power rail 104 to, the local power rail 202. For the reverse operation, each power-multiplexer tile 1002 is also configured to switch from using the second global power rail 104 to using the first global power rail 102 to supply power to the circuit load 210 via the local power rail 202.

This power multiplexing operation entails addressing a number of competing difficulties. First, the circuit load 210 cannot be without any power for an extended period of time or the intrinsic capacitance thereof becomes exhausted and data that is intended to be retained can be lost. Second, if both of the first global power rail 102 and the second global power rail 104 are simultaneously coupled to the local power rail 202, a short-circuit current condition is created between the two global power rails having different voltage levels. This short-circuit current condition can waste considerable power. Third, if the power is supplied to the circuit load 210 too suddenly, current rushes into the circuit load 210 from the newly-coupled global power rail. This inrush current can cause the global voltage level of the corresponding global power rail to droop below an intended minimum level, which can adversely affect other power domains or circuit loads that are being powered by the global power rail undergoing the drooping voltage.

The third difficulty is addressed by distributing the power multiplexer 402 across a number of power-multiplexer tiles 1002 disposed in a chained arrangement. The power can therefore be gradually introduced to the circuit load 210 in stages by sequentially activating the individual power-multiplexer tiles 1002 to thereby switch connections between the global power rails one power-multiplexer tile at a time. The first and second difficulties can be addressed jointly based on the timing of the power-multiplexing operation along the chained arrangement of power-multiplexer tiles 1002 on a per-power-multiplexer tile basis or based on how the switching is performed within each power-multiplexer tile 1002. These aspects are described below.

Each power-multiplexer tile 1002 is depicted as including a first switching circuit 1012 and a second switching circuit 1014. Each switching circuit can include at least one transistor (not explicitly shown). These first and second switching circuits can be carefully controlled to perform the power-multiplexing operation so that the local power rail 202 can be held at the local voltage 204 during at least a portion of the operation. If one or more of the power-multiplexer tiles 1002 connect the first global power rail 102 to the local power rail 202, the local power rail 202 can be held at the first global voltage 112. If one or more power-multiplexer tiles 1002 connect the second global power rail 104 to the local power rail 202, the local power rail 202 can be held at the second global voltage 114.

For example power multiplexer 402 implementations having a chained arrangement, the multiple power-multiplexer tiles 1002-1, 1002-2, 1002-3, . . . are coupled in series, at least from the perspective of control signal propagation. The terminating power-multiplexer tile in the series, the power-multiplexer tile 1002-1, is called the "last" power-multiplexer tile herein. Thus, the power-multiplexer tile 1002-2 is called the "second-to-last" power-multiplexer tile, and the power-multiplexer tile 1002-3 is called the "third-to-last" power-multiplexer tile. As shown, each of the power-multiplexer tiles 1002-3, 1002-2, and 1002-1 is coupled between both the first and second global power rails 102 and 104 and the local power rail 202 via the first and second switching circuits 1012 and 1014, respectively. More specifically, each first switching circuit 1012 is coupled between the first global power rail 102 and the local power rail 202, and each second switching circuit 1014 is coupled between the second global power rail 104 and the local power rail 202.

The power-multiplexer control signals 1016 and the power-multiplexer control circuitry 1004 are depicted as cloud shapes to represent that the signals and the circuitry, respectively, are distributed across the multiple power-multiplexer tiles 1002-3, 1002-2, and 1002-1. A portion of the power-multiplexer control circuitry 1004 can be disposed internal to each power-multiplexer tile 1002. Additionally or alternatively, a portion of the power-multiplexer control circuitry 1004 can be disposed external of the multiple power-multiplexer tiles 1002-3, 1002-2, and 1002-1. For instance, the power-multiplexer control circuitry 1004 can be disposed between or among the multiple power-multiplexer tiles 1002-3, 1002-2, and 1002-1 to propagate one or more signals of the power-multiplexer control signals 1016.

The individual power-multiplexer tiles 1002 can therefore operate responsive to the power-multiplexer control signals 1016.

Using the power-multiplexer control signals 1016, the power-rail switching for the power-multiplexing operation can be performed sequentially from one power-multiplexer tile 1002 to a consecutive power-multiplexer tile 1002 along the chained arrangement of tiles. The thick dashed arrows 1006 indicate a sequential progression of the power-rail switching from left to right. At the last power-multiplexer tile 1002-1, the direction of progression for the power-multiplexing operation along the chained arrangement of tiles reverses as indicated by the thick dashed-and-solid arrow 1008. The thick solid arrows 1010 indicate a sequential progression of the power-rail switching in a reverse direction from right to left. More generally, the power-multiplexer control circuitry 1004 implements a power rail transition procedure, examples of which are described below.

In an example power rail transition procedure, the power-multiplexer control circuitry 1004 causes the multiple power-multiplexer tiles 1002-3, 1002-2, and 1002-1 to switch from an origin power rail to a destination power rail to perform a power-multiplexing operation. Generally, this power source multiplexing can be performed at least partially sequentially by changing a switching state (e.g., open or closed) of the first switching circuits 1012 in an order that starts from a "first" power-multiplexer tile 1002 (not shown on far left) and continues in a direction along the arrows 1006. Thus, the operation continues to the third-to-last power-multiplexer tile 1002-3, then to the second-to-last power-multiplexer tile 1002-2, and concludes at the last power-multiplexer tile 1002-1. If the switching circuits are implemented using one or more transistors, a transistor that is turned off corresponds to an open switch state that blocks current flow, and a transistor that is turned on corresponds to a closed switch state that enables current flow. The power source switching is continued by changing the switching state of the second switching circuits 1014 in a reverse sequential order by starting with the last power-multiplexer tile 1002-1 and continuing in a direction along the arrows 1010.

Power-multiplexing operations can be implemented differently in accordance with different approaches to addressing the first and second competing difficulties described above. Three approaches to managing inrush current are described below in the context of a power-multiplexing operation in which the power multiplexer 402 is switching from coupling the first global power rail 102 to the local power rail 202 to coupling the second global power rail 104 to the local power rail 202.

In a first approach, cross-conduction current between the first global power rail 102 and the second global power rail 104 is prevented by avoiding having a first switching circuit 1012 and a second switching circuit being simultaneously closed. To do so, the power-multiplexer control circuitry 1004 sequentially opens the first switching circuits 1012 in the direction of the arrows 1006. After the first switching circuit 1012 at the last power-multiplexer tile 1002-1 is opened, the second switching circuit 1014 there is closed as represented by the arrow 1008. Thereafter, the second switching circuits 1014 are closed continuing from the power-multiplexer tile 1002-2 and moving leftward in the direction of the arrows 1010. Although cross-conduction currents are prevented with this first approach, the circuit load 210 is temporarily unpowered, which risks data retention instability during the power-multiplexing operation.

In a second approach to managing cross-conduction current, some overlap between two or more of the first switching circuits 1012 and the second switching circuits 1014 being closed is permitted. In other words, one or more selected power-multiplexer tiles 1002 is enabled to close the second switching circuit 1014 out of the sequential order during an overlap phase of a power-multiplexing operation. This second approach does result in a cross-conduction current condition between the first global power rail 102 and the second global power rail 104. However, the flow of current between these two global power rails can be retarded somewhat by spatially separating any two first switching circuit 1012 and second switching circuit 1014 that are simultaneously closed. Additionally or alternatively, the time period of the overlap can be reduced, such as by enabling the second switching circuit 1014 of the second-to-last power-multiplexer tile 1002-2 to be closed while just the first switching circuit 1012 of the last power-multiplexer tile 1002-1 still remains closed.

In a third approach to managing cross-conduction current, the first switching circuits 1012 and the second switching circuits 1014 can include at least one switch having a one-way current mode. For example, a diode-connected transistor can be employed to permit current to flow from a global power rail toward the local power rail 202 and to prevent current flow from the local power rail 202 back to a global power rail. In an example implementation, multiple switches can be utilized in each switching circuit including a two-way, relatively larger transistor that permits bidirectional current flow and a one-way, relatively smaller transistor that permits unidirectional current flow. In operation, the two-way transistor is employed during normal powering periods, but the one-way, diode-connected transistor is employed during the power-multiplexing periods to control the potential cross-conduction current.

FIGS. 11-16 illustrated respective graphs 1100-1600 that depict processing performance along the horizontal x-axis and power consumption along the vertical y-axis. The processing performance scale runs from 0% to 100%. The power consumption scale on the left side runs from 0 milliwatts (mW) to 500 mW and has a corresponding 0% to 100% scale on the right side. Each graph includes at least three curves. A power curve 1102 having straight line segments is shown as a dashed line and represents a sample performance for an example duty cycling implementation as described herein. An ideal smooth power curve 1104 is shown as a thicker solid line with solid circles and represents a sample performance with a conventional approach to dynamic voltage and frequency scaling. The smooth power curves 1104 in the graphs 1100-1500 are idealized implementations of dynamic voltage and frequency scaling, but the power curve 1104 in the graph 1600 is a practical implementation of dynamic voltage and frequency scaling (DVFS). A power overhead curve 1106 is depicted in each of the graphs 1100 to 1600 and is shown as a dotted line. The power overhead curve 1106 represents the additional power overhead for the straight line segments of the power curve 1102 with respect to an ideal or practical DVFS power curve 1104 at any given time. The 0% to 120% scaling on the right side also applies to the power overhead curves 1106 and represents a power overhead percentage for these curves. FIG. 17 illustrates a graph 1700 that depicts processing performance along the horizontal x-axis and power overhead along the vertical y-axis and that includes a power overhead curve 1106.

Figure 11:
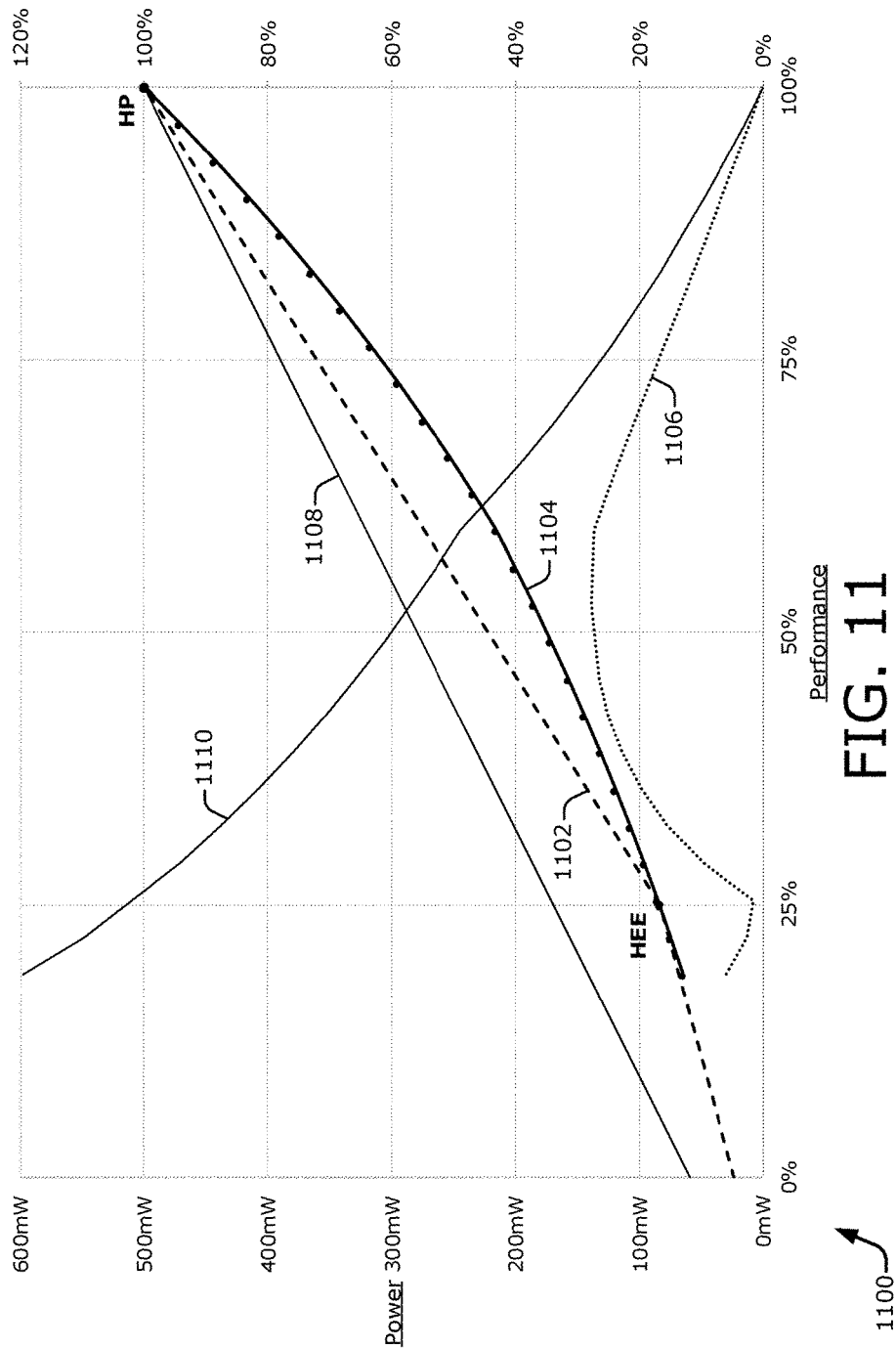
FIG. 11 depicts an example graph of processing performance versus power consumption for two power states, including a high performance power state and a high energy efficiency power state, which is shown relative to an idealized dynamic voltage and frequency scaling implementation.
Figure 12:
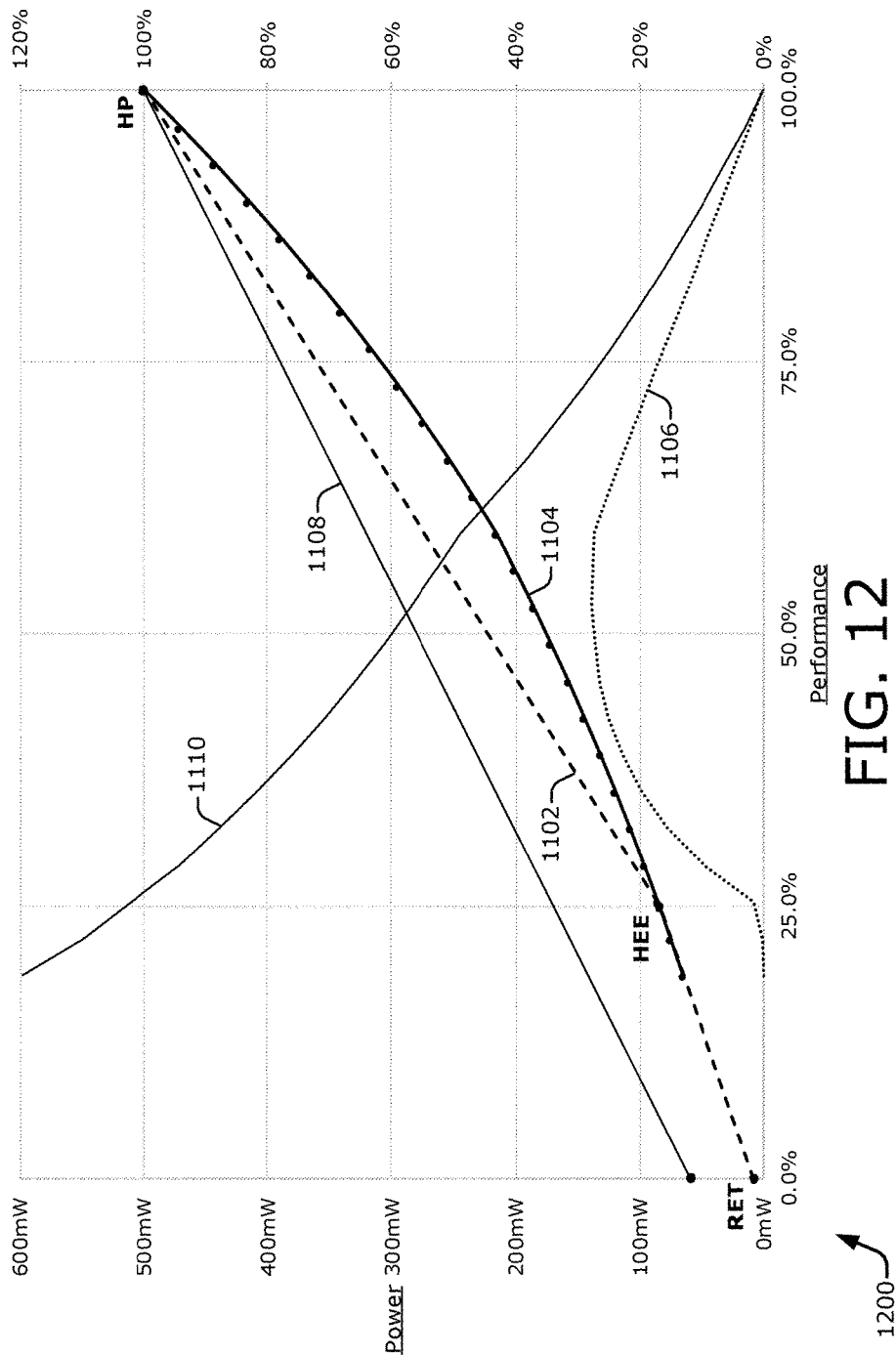
FIG. 12 depicts an example graph of processing performance versus power consumption for three power states, including an additional retention power state.
Figure 13:
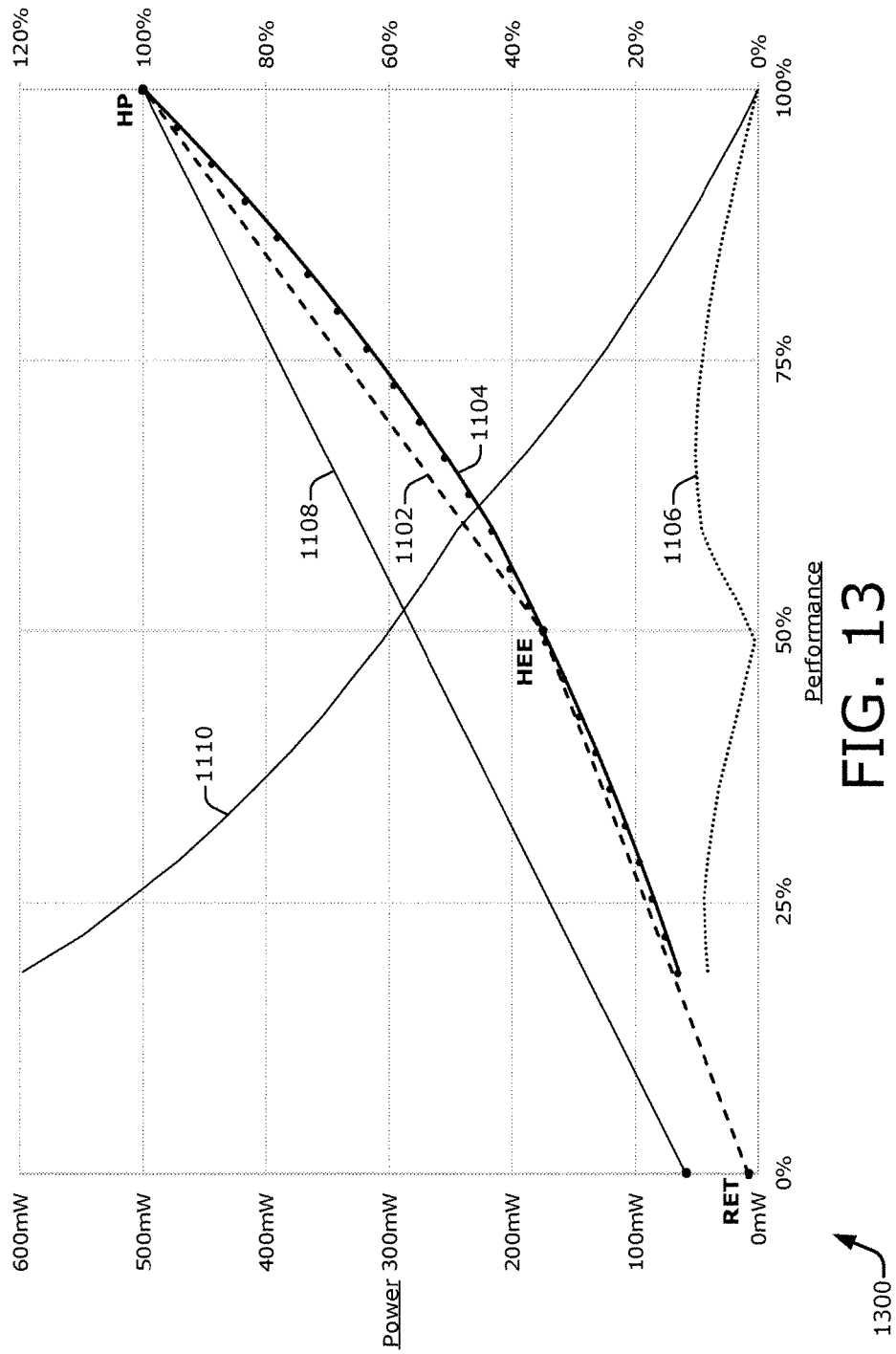
FIG. 13 depicts another example graph of processing performance versus power consumption for three power states, including the additional retention power state.

In the graphs 1100-1300 of FIGS. 11-13, a DFS curve 1108 and a DFS overhead-versus-ideal DVFS curve 1110 are both illustrated as solid thinner lines. The DFS curve 1108 depicts a power/performance curve for just frequency scaling. A power domain is maintained at a fixed high voltage level that is determined by the highest efficiency point. Any lower-performance operating point is achieved by reducing the clock rate, either by changing the frequency of the clock signal produced by a PLL or by gating the clock signal. The DFS overhead-versus-ideal DVFS curve 1110 depicts the power overhead of a DFS technique compared to an ideal DVFS technique. The DFS overhead-versus-ideal DVFS curve 1110 represents the difference between the DFS power and the ideal DVFS power expressed as a percentage of the ideal DVFS power. The graphs 1100-1300 reveal that the overhead becomes significantly larger at lower-performance operating points. For example, the DFS technique has a +120% power overhead at 20% performance. This contrasts with an example of a described duty cycling implementation having an, e.g., 0% overhead as depicted in FIG. 12 at such lower-performance operating points.

This difference in the lower performance region is particularly relevant because mobile electronic devices typically operate for a majority of the time in the lower performance region as compared to the higher performance regions. Consequently, efficiency in the lower performance region has a relatively larger impact on the overall power optimization. Thus, based on an expected contribution of each performance range in a typical "day of use" scenario, a system architect may decide to implement the settings of FIG. 12, which is appropriate for a lowest-performance range; the settings of FIG. 13, which is balanced across each of the performance ranges; or the settings of FIG. 15, which produce a superior result but entails a higher system cost with four voltage levels.

Each of the power curves 1102 across the graphs 1100-1600 have 2-4 points corresponding to examples of available power states. These example operating points are indicated with the following letter abbreviations: HP—high performance (HP) power state (or relatively higher performance power state); HEE—high energy efficiency (HEE) power state (or relatively lower performance power state); RET—retention (RET) level power state; and MP—middle performance (MP) power state. The example values that are set forth below for the graphed power states are approximate: The HP power state is set at 100% of processing performance and 100% (500 mW) of power consumption. If included in a particular graph, the RET power state is set at 0% of processing performance and 1.4% (7 mW) of power consumption. If included in a particular graph, the MP power state is set at 50% of processing performance and 35% (175 mW) of power consumption. Different examples of HEE power states are used in different ones of the graphs. In some examples, the HEE power state is set at 50% of processing performance and 35% (175 mW) of power consumption. In other examples, the HEE power state is set at 25% of processing performance and 17% (84 mW) of power consumption.

For the example graphs having an RET power state, a retention global power rail (not shown) distributes a retention voltage level to each power domain as a third global power rail. The HP power state in each graph corresponds to one global power rail. The HEE and MP power states correspond to another global power rail. In addition to using the other global power rail that differs from that of the HP power state, the different HEE and MP power states shown in these graphs are established using different frequency divider divisor values, which are specified below. However, different HEE and MP power states can alternatively be established by multiplexing a third (non-retention) global power rail onto a local power rail. Although not illustrated or addressed explicitly by a graph, four global power rails can be implemented, such as with an integrated circuit including an RET global power rail, an HEE global power rail, an MP global power rail, and an HP global power rail. Further, more than four global power rails may also be implemented.

FIG. 11 depicts a graph 1100 including an HEE power state and an HP power state. In the graph 1100, the HEE power state is set to 25% of processing performance and has a frequency one-fourth that of the HP power state. At any given performance level (besides at the HEE and HP points), the power curve 1102 exhibits some power overhead as compared to the ideal smooth power curve 1104. As shown by the power overhead curve 1106, this overhead peaks at about 28% in the 50-60% processing performance range.

FIG. 12 depicts a graph 1200 including an RET power state, an HEE power state, and an HP power state. The graph 1200 is similar to the graph 1100, except with the addition of the RET power state. With this addition, the energy efficiency is nearly optimum below the approximately 25% performance level.

FIG. 13 depicts a graph 1300 including an RET power state, an HEE power state, and an HP power state. The graph 1300 is similar to the graph 1200 except that the HEE power state has a different processing performance level. Here, the HEE power state is set to 50% of processing performance and has a frequency one-half that of the HP power state. At any given performance level (besides at the HEE and HP points), the power curve 1102 exhibits some power overhead as compared to the ideal smooth power curve 1104. However, the difference is less as compared to the graph 1100. As shown by the power overhead curve 1106 in the graph 1300, the overhead peaks at about just 10% in the 60-70% processing performance range.

Figure 14:
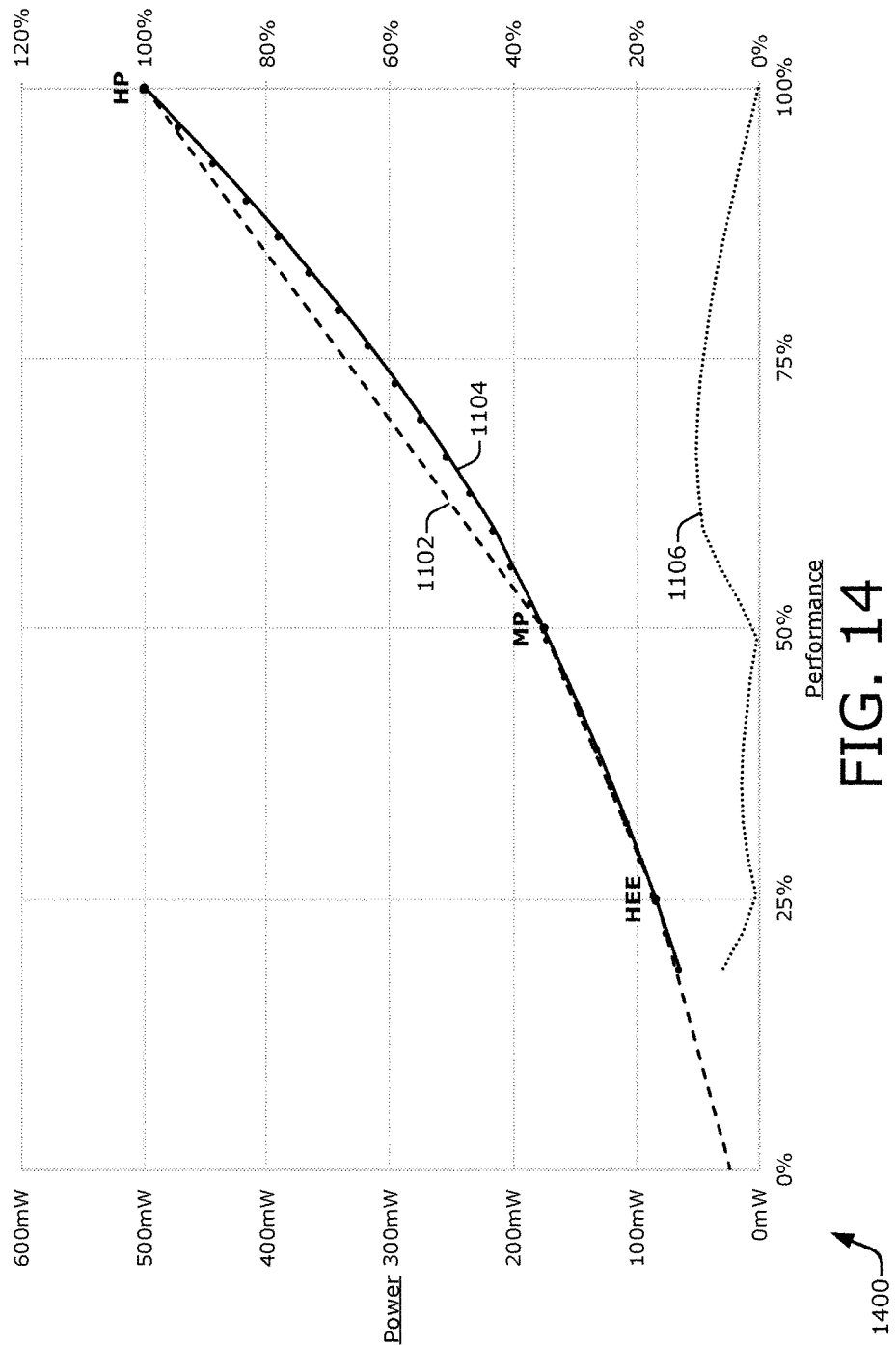
FIG. 14 depicts an example graph of processing performance versus power consumption for three power states, including an additional medium performance power state.

FIG. 14 depicts a graph 1400 including an HEE power state, an MP power state, and an HP power state. In FIG. 14, the HEE power state is set to 25% of processing performance and has a frequency one-fourth that of the HP power state. The MP power state is set to 50% of processing performance and has a frequency one-half that of the HP power state. As shown by the power overhead curve 1106 in the graph 1400, the overhead still peaks at about 10% in the 60-70% processing performance range. However, the power overhead curve 1106 has lower levels in the 25-45% processing performance range as compared to that of FIG. 13.

Figure 15:
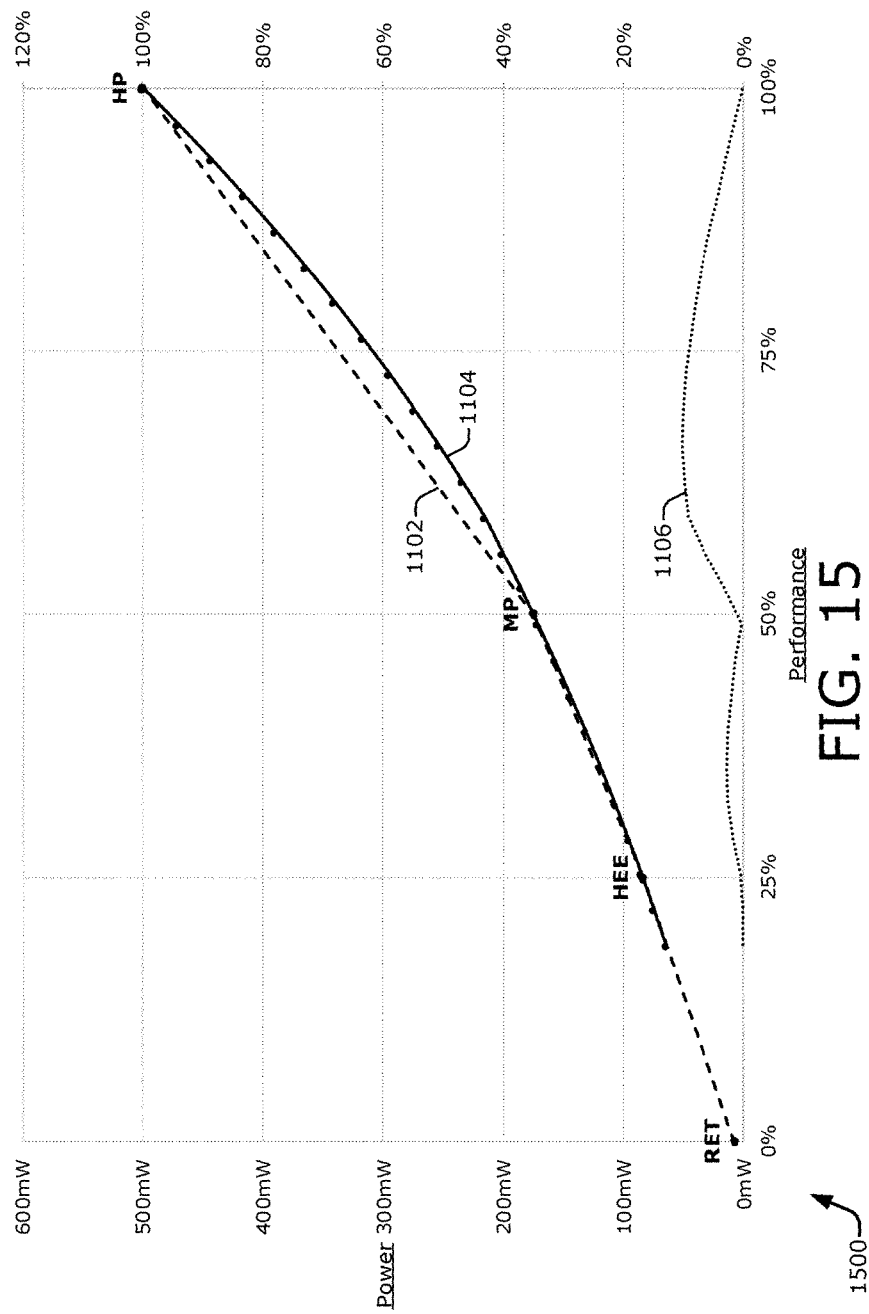
FIG. 15 depicts an example graph of processing performance versus power consumption for four power states, including both an additional retention power state and an additional medium performance power state.

FIG. 15 depicts a graph 1500 including an RET power state, an HEE power state, an MP power state, and an HP power state. The graph 1500 is similar to the graph 1400, except with the addition of the RET power state. Like in FIG. 12 with respect to FIG. 11, the addition of the RET power state lowers the overhead in the lower performance region. Consequently, below the approximately 50% performance level, the energy efficiency of a duty cycling implementation with these settings nearly matches that of an ideal DVFS.

Each of the graphs 1100-1500 illustrate some level of power overhead for implementing a duty cycle approach to voltage and frequency adjustment as represented by the power curves 1102 in comparison to conventional approaches to dynamic voltage and frequency scaling as represented by the ideal smooth power curves 1104. The overhead is explicitly indicated via the power overhead curves 1106. These explicit indications, however, are overstated for a number of reasons. First, the graphs fail to account for energy efficiencies that can be realized by independently adjusting different blocks so that no block is forced, or at least fewer blocks are forced, to operate on a higher voltage than is necessary by another block using the same power rail. Second, because the power management integrated circuit can avoid changing supplied voltages, capacitors are not charged up each time a voltage adjustment is to be made. Third, in FIGS. 11-15, the ideal smooth power curves 1104 represent an idealized dynamic voltage and frequency scaling implementation that utilizes significantly more quantized voltage-frequency states than a practical implementation is likely to be able to utilize. A practical, stair-stepped power curve 1104 that is based on a more realistic dynamic voltage and frequency scaling implementation is shown in FIG. 16.

Figure 16:
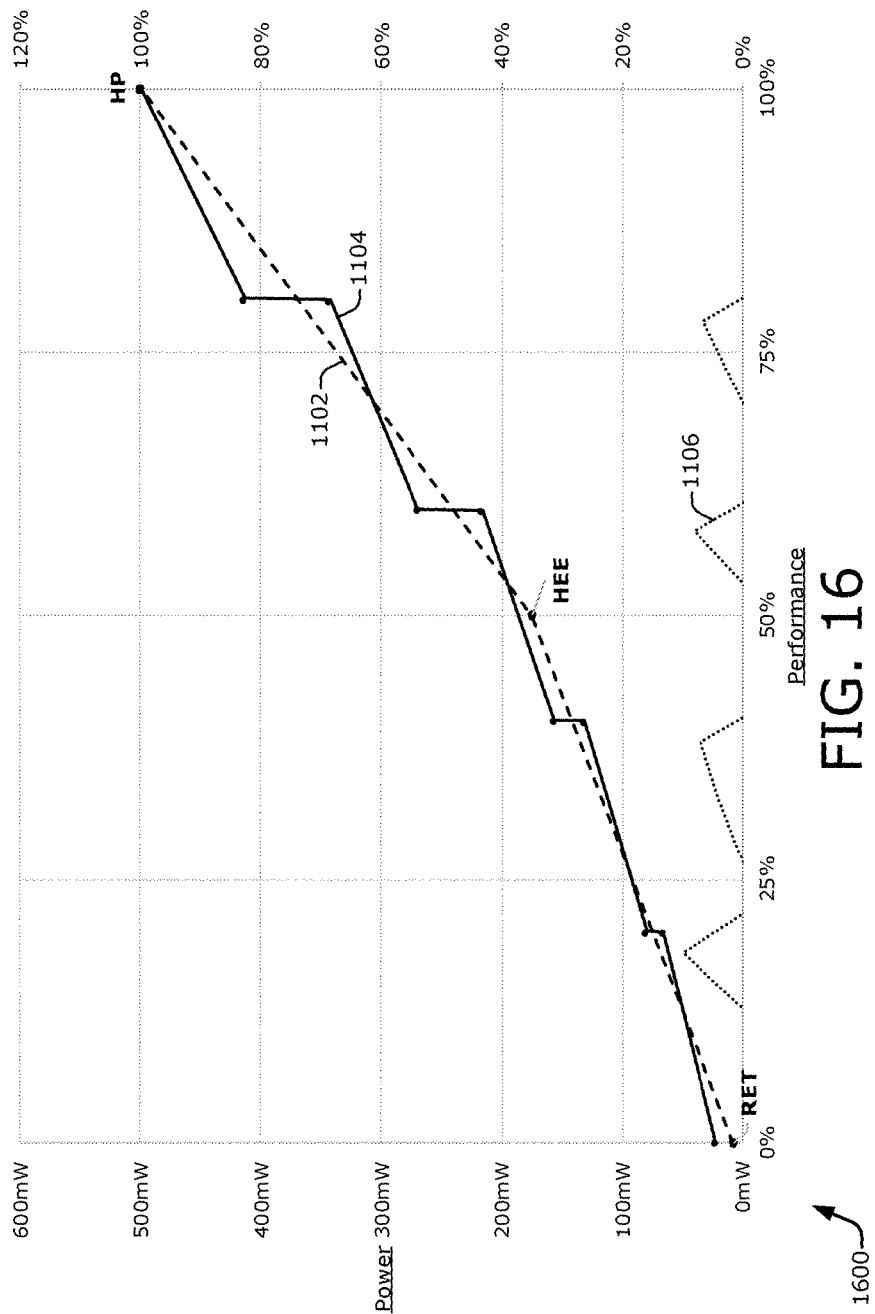
FIG. 16 depicts an example graph of processing performance versus power consumption for three power states—including a high performance power state, a high energy efficiency power state, and a retention power state—which is shown relative to a practical dynamic voltage and frequency scaling (DVFS) implementation.
Figure 17:
FIG. 17 depicts an example graph of power overhead versus ideal DVFS for an example implementation of duty cycling using the scenario of FIG. 16.

FIG. 16 depicts a graph 1600 including an RET power state, an HEE power state, and an HP power state. Like the graph 1300, the HEE power state is set to 50% of processing performance and has a frequency one-half that of the HP power state. Unlike the graph 1300, the power curve 1102 is shown relative to a practical dynamic voltage and frequency scaling implementation that is represented by the stair-stepped power curve 1104. There are fewer available voltage-frequency states in the practical implementation. Consequently, the power curve 1104 has a stair-stepped appearance. The power curve 1102 is therefore above the stair-stepped power curve 1104 for some processing performance ranges but also below the stair-stepped power curve 1104 for other processing performance ranges. This is reflected by the power overhead curve 1106, which never exceeds 10% power overhead and dips below 0% in some processing performance ranges, such as the approximately 40-55% and 60-70% processing performance ranges. This is shown more clearly in FIG. 17.

FIG. 17 depicts a graph 1700 of power overhead versus ideal DVFS for an example implementation of duty cycling using the settings described above for the graph 1600 of FIG. 16. The full power overhead curve 1106 is shown from a 0% performance level to a 100% performance level. The full power overhead curve 1106 extends both above and below the 0% overhead line to create shaded overhead zones. The overhead zones above the 0% overhead line are shaded with a brick pattern. The "negative overhead" or gain zones below the 0% overhead line are shaded in a solid-appearing, fine dotted pattern. The overhead is capped at 10%. The negative overhead, or gain, is generally less than 10%. However, in the lower performance region, where most mobile electronic devices operate for the majority of the time, the gain is greater than 50%. Further, in reality, the gain zones are appreciably larger for the reasons presented above between the descriptions of FIGS. 15 and 16.

Figure 18:
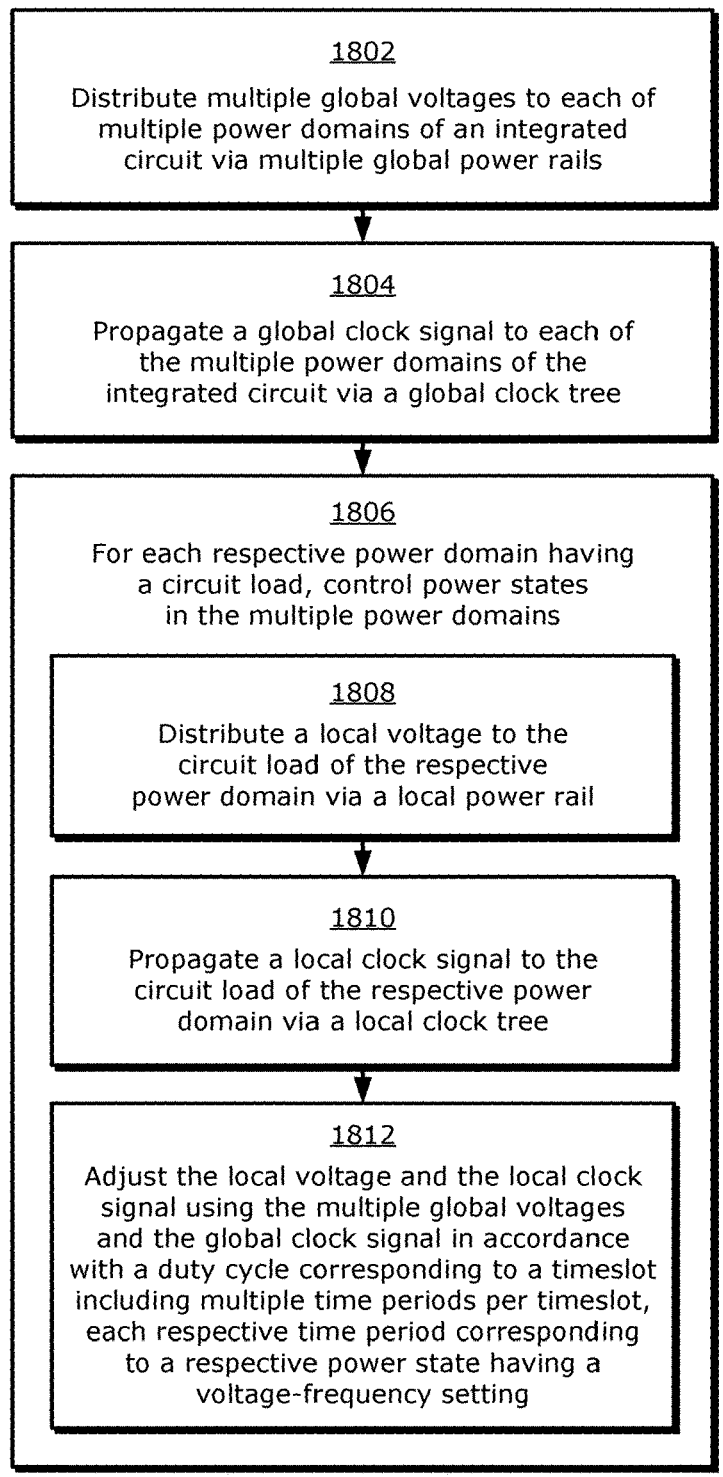
FIG. 18 is a flow diagram illustrating an example process for power management using duty cycles.

FIG. 18 is a flow diagram illustrating an example process 1800 for power management using duty cycles. The process 1800 is described in the form of a set of blocks 1802-1812 that specify operations that can be performed. However, operations are not necessarily limited to the order shown in FIG. 18 or described herein, for the operations may be implemented in alternative orders or in fully or partially overlapping manners. Operations represented by the illustrated blocks of the process 1800 may be performed by an integrated circuit, such as the integrated circuit 100 of FIG. 1 or the integrated circuit 1910 of FIG. 19, which is described below. More specifically, the operations of the process 1800 may be performed by the global supply lines, the local supply lines, and the power state controller 110 that are illustrated in FIG. 4.

At block 1802, multiple global voltages are distributed to each of multiple power domains of an integrated circuit via multiple global power rails. For example, an integrated circuit 100 can distribute multiple global voltages to each of multiple power domains 108 of the integrated circuit 100 via multiple global power rails. For instance, a first global power rail 102 may distribute a first global voltage 112, and a second global power rail 104 may distribute a second global voltage 114. At block 1804, a global clock signal is propagated to each of the multiple power domains of the integrated circuit via a global clock tree. For example, the integrated circuit 100 can propagate a global clock signal 116 to each of the multiple power domains 108 via a global clock tree 106.

At block 1806, power states are controlled in the multiple power domains for at least those respective power domain having a locally-controllable circuit load. For example, the integrated circuit 100 can control respective power states 308 in the multiple power domains 108 for each respective power domain 108 having a locally-controllable circuit load 210. To do so, a respective power state controller 110 for each respective power domain 108 may act as a bridge between global supply lines of the integrated circuit 100 and local supply lines of the respective power domain 108. The power states in each respective power domain are controlled using the operations of blocks 1808-1812.

At block 1808, a local voltage is distributed to the circuit load of the respective power domain via a local power rail. For example, a respective power domain 108 can distribute a local voltage 204 to the circuit load 210 of the respective power domain 108 via a local power rail 202. At block 1810, a local clock signal is propagated to the circuit load of the respective power domain via a local clock tree. For example, the respective power domain 108 can propagate a local clock signal 208 to the circuit load 210 via a local clock tree 206.

At block 1812, the local voltage and the local clock signal are adjusted using the multiple global voltages and the global clock signal in accordance with a duty cycle corresponding to a timeslot including multiple time periods per timeslot, with each respective time period corresponding to a respective power state having a voltage-frequency setting. For example, the respective power domain 108 can adjust the local voltage 204 and the local clock signal 208 using the multiple global voltages and the global clock signal 116, respectively, in accordance with a duty cycle 306 corresponding to a timeslot 310 including multiple time periods 312 per timeslot 310. Each respective time period 312 corresponds to a respective power state 308 having a voltage-frequency setting. To adjust the local voltage 204, a power state controller 110 of the respective power domain 108 may multiplex from one global power rail to another global power rail of the multiple global power rails. More specifically, to adjust the local voltage 204 on the local power rail 202, a power multiplexer 402 may switch from coupling the first global power rail 102 to the local power rail 202 to coupling the second global power rail 104 to the local power rail 202, or vice versa, at each time period 312, with each time period 312 having a relative duration derived from a duty cycle parameter 314. To adjust the local clock signal 208, the power state controller 110 may change a divisor value 408 that is applied to a frequency of the global clock signal 116 to divide the frequency value of the global clock signal 116 using a frequency divider 406 at each time period 312.

Example implementations of the process 1800 can further include an operation of obtaining a performance level indicator signal 608 indicative of respective updated durations of respective time periods 312 of the multiple time periods 312 per timeslot 310. In such implementations, the adjustment operation of the block 1812 can further include adjusting the local voltage 204 and the local clock signal 208 based on the respective updated durations of the respective time periods 312 across multiple timeslots 310.

Example implementations for the adjustment operation of the block 1812 can further include triggering a change to a frequency level of the local clock signal 208 and a change to a voltage level of the local voltage 204 based on respective durations of the multiple time periods 312 included in each timeslot 310.

Example implementations for the adjustment operation of the block 1812 can further include operating the respective power domain 108 at a first power state 308-1 having a first-voltage frequency setting during a first time period 312-1 having a first duration as part of a duty cycle 306 and at a second power state 308-2 having a second voltage-frequency setting during a second time period 312-2 having a second duration as part of the duty cycle 306. The adjustment operation can still further include repeating the operating of the respective power domain 108 for the first duration and the second duration as part of a subsequent timeslot 310.

Example implementations for the controlling operation of the block 1806 can further include any one or more of the following four operations. First is operating the circuit load 210 based on the local voltage 204 and the local clock signal 208 being adjusted in accordance with the duty cycle 306 including the multiple time periods 312 per timeslot 310, with the multiple time periods 312 per timeslot 310 having respective first durations that correspond to a first average power consumption 502-1 for the circuit load 210. Second is altering lengths of the multiple time periods 312 per timeslot 310 to instantiate another duty cycle 306, with the other duty cycle 306 corresponding to the multiple time periods 312 having respective second durations that correspond to a second average power consumption 502-2 for the circuit load 210. Third is adjusting the local voltage 204 and the local clock signal 208 using the multiple global voltages and the global clock signal 116 in accordance with the other duty cycle 306 including the multiple time periods 312 per timeslot 310, with each respective time period 312 corresponding to the respective power state 308 having the voltage-frequency setting. Fourth is operating the circuit load 210 based on the local voltage 204 and the local clock signal 208 being adjusted in accordance with the other duty cycle 306 corresponding to the multiple time periods 312 per timeslot 310, with the multiple time periods 312 per timeslot 310 having the respective second durations corresponding to the second average power consumption 502-2 for the circuit load 210.

Figure 19:
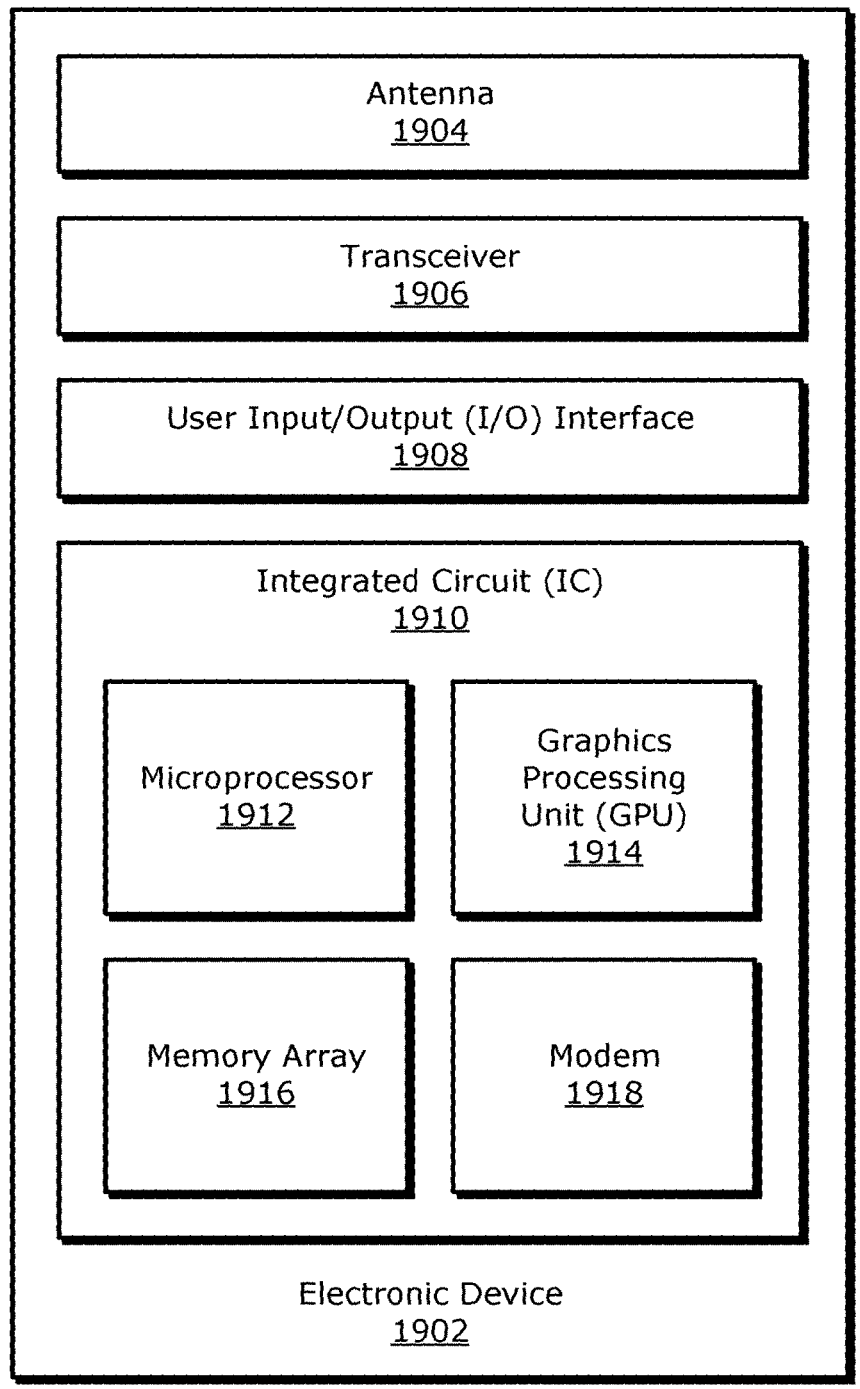
FIG. 19 illustrates an example electronic device that includes an integrated circuit in which power management using duty cycles can be implemented.

FIG. 19 depicts an example electronic device 1902 that includes an integrated circuit (IC) 1910 having multiple blocks or cores. As shown, the electronic device 1902 includes an antenna 1904, a transceiver 1906, and a user input/output (I/O) interface 1908 in addition to the integrated circuit 1910. Illustrated examples of the integrated circuit 1910, or cores thereof, include the microprocessor 1912, a graphics processing unit (GPU) 1914, a memory array 1916, and a modem 1918. In one or more implementations, power management techniques as described herein can be implemented by the integrated circuit 1910, e.g., by separating the circuitry blocks thereof into different power domains.

The electronic device 1902 can be a mobile or battery-powered device or a fixed device that is designed to be powered by an electrical grid. Examples of the electronic device 1902 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1902 can also be a device, or a portion thereof, having embedded electronics. Examples of the electronic device 1902 with embedded electronics include a passenger vehicle, industrial equipment, a refrigerator or other home appliance, a drone or other unmanned aerial vehicle (UAV), a power tool, or an Internet of Things (IoT) device.

For an electronic device with a wireless capability, the electronic device 1902 includes an antenna 1904 that is coupled to a transceiver 1906 to enable reception or transmission of one or more wireless signals. The integrated circuit 1910 may be coupled to the transceiver 1906 to enable the integrated circuit 1910 to have access to received wireless signals or to provide wireless signals for transmission via the antenna 1904. The electronic device 1902 as shown also includes at least one user I/O interface 1908. Examples of the user I/O interface 1908 include a keyboard, a mouse, a microphone, a touch-sensitive screen, a camera, an accelerometer, a haptic mechanism, a speaker, a display screen, or a projector.

The integrated circuit 1910 may comprise, for example, one or more instances of a microprocessor 1912, a GPU 1914, a memory array 1916, a modem 1918, and so forth. The microprocessor 1912 may function as a central processing unit (CPU) or other general-purpose processor. Some microprocessors include different parts, such as multiple processing cores, that may be individually powered on or off. The GPU 1914 may be especially adapted to process visual-related data for display. If visual-related data is not being rendered or otherwise processed, the GPU 1914 may be fully or partially powered down. The memory array 1916 stores data for the microprocessor 1912 or the GPU 1914. Example types of memory for the memory array 1916 include random access memory (RAM), such as dynamic RAM (DRAM) or static RAM (SRAM); flash memory; and so forth. If programs are not accessing data stored in memory, the memory array 1916 may be powered down overall or by individual areas. The modem 1918 demodulates a signal to extract encoded information or modulates a signal to encode information into the signal. If there is no information to decode from an inbound communication or to encode for an outbound communication, the modem 1918 may be idled to reduce power consumption. The integrated circuit 1910 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1910 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, like that of an integrated circuit 1910 generally, may be termed cores or blocks of circuitry. A core or block of an SOC may be powered down if not in use, such as by undergoing a power collapse or being multiplexed onto a power rail having a lower voltage level, according to the techniques described in this document. Examples of cores or blocks include, in addition to those that are illustrated in FIG. 19, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or blocks, such as a processing or GPU core, may further include multiple internal cores or blocks that can be individually powered.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
   a first global power rail configured to be held at a first global voltage;
   a second global power rail configured to be held at a second global voltage;
   a global clock tree configured to propagate a global clock signal; and
   multiple power domains, each power domain including a respective power state controller including:
      a power multiplexer coupled to the first global power rail and the second global power rail;
      a frequency divider coupled to the global clock tree; and
      a duty cycle manager configured to adjust a power state of a respective power domain of the multiple power domains based on a duty cycle parameter using the power multiplexer and the frequency divider.

2. The integrated circuit of claim 1, wherein the duty cycle manager is configured, based on the duty cycle parameter, to institute a recurrent timeslot having a duration that is separated into at least two time periods, each time period corresponding to a respective power state.

3. The integrated circuit of claim 2, wherein each respective power state comprises a voltage-frequency setting of the respective power domain.

4. The integrated circuit of claim 2, wherein each respective power domain comprises:
   a local power rail configured to be held at a local voltage, the local power rail coupled to the power multiplexer; and
   a local clock tree configured to propagate a local clock signal, the local clock tree coupled to the frequency divider.

5. The integrated circuit of claim 4, wherein the duty cycle manager is configured to cause the power multiplexer to select from among at least the first global power rail or the second global power rail for connection to the local power rail and to cause the frequency divider to divide the global clock signal by a selected divisor value to produce the local clock signal in dependence on which time period is currently in effect of the at least two time periods of the recurrent timeslot.

6. The integrated circuit of claim 5, wherein the selected divisor value is selected from a group of divisor values comprising powers of two.

7. The integrated circuit of claim 1, wherein the duty cycle manager is configured to adjust operation of the respective power domain between a higher performance power state and a lower performance power state based on the duty cycle parameter, the higher performance power state having a higher voltage level and a higher clock frequency relative to the lower performance power state.

8. The integrated circuit of claim 7, wherein the duty cycle manager comprises timing circuitry configured to establish a recurrent timing at which operation of the respective power domain is adjusted between the higher performance power state and the lower performance power state across multiple timeslots in accordance with a duty cycle indicated by the duty cycle parameter, the duty cycle corresponding to respective durations for the higher performance power state and the lower performance power state.

9. The integrated circuit of claim 1, wherein the duty cycle manager comprises timeslot instantiation circuitry configured to establish multiple time periods of a recurrent timeslot in accordance with a duty cycle indicated by the duty cycle parameter, each time period corresponding to a respective power state.

10. The integrated circuit of claim 9, wherein the timeslot instantiation circuitry is configured to establish relative durations of the multiple time periods within the recurrent timeslot based on a utilization metric associated with the respective power domain.

11. The integrated circuit of claim 9, wherein the timeslot instantiation circuitry is configured to establish relative durations of the multiple time periods within the recurrent timeslot based on a performance level indicator signal.

12. The integrated circuit of claim 11, wherein the performance level indicator signal is expressed as a proportionality of a duration of the recurrent timeslot.

13. The integrated circuit of claim 1, wherein:
   the duty cycle parameter indicates a duty cycle for multiple time periods of a recurrent timeslot for a timeframe; and
   the duty cycle manager is configured to adjust the power state of the respective power domain in accordance with the duty cycle at each recurrent timeslot of the timeframe over multiple recurrent timeslots.

14. The integrated circuit of claim 13, wherein the duty cycle corresponds to respective durations for respective time periods of the multiple time periods.

15. The integrated circuit of claim 14, wherein:
   the duty cycle parameter subsequently indicates another duty cycle for the multiple time periods of the recurrent timeslot for another timeframe; and
   the duty cycle manager is configured to adjust the power state of the respective power domain in accordance with the other duty cycle at each recurrent timeslot of the other timeframe over multiple recurrent time slots.

16. The integrated circuit of claim 1, wherein:
   each respective power state controller of each respective power domain of the multiple power domains is independent of other power state controllers of other power domains; and
   the duty cycle manager of each respective power state controller is configured to adjust the power state of the respective power domain based on a respective duty cycle parameter that is separate from other duty cycle parameters for other duty cycle managers.

17. The integrated circuit of claim 16, wherein:
each respective duty cycle parameter is indicative of a respective duty cycle;
one respective power state controller is configured to operate one respective power domain of the multiple power domains in accordance with one respective duty cycle that is altered in one manner; and
another respective power state controller is configured to operate another respective power domain of the multiple power domains in accordance with another respective duty cycle that is altered in another manner.

18. The integrated circuit of claim 1, wherein:
the multiple power domains include a first power domain and a second power domain;
a first power state controller of the first power domain is configured to establish a first power state for the first power domain, and a second power state controller of the second power domain is configured to establish a second power state for the second power domain; and
the multiple power domains are configured to facilitate inter domain communication by compensating for the first power state being different from the second power state.

19. The integrated circuit of claim 18, further comprising:
a level shifter configured to increase a voltage level of a signal propagating from the first power domain to the second power domain responsive to the first power state having a lower voltage level than the second power state.

20. The integrated circuit of claim 18, further comprising:
phase adjustment circuitry configured to align a first local clock signal of the first power domain with a second local clock signal of the second power domain based on at least one of the first power state or the second power state.

21. The integrated circuit of claim 20, wherein the phase adjustment circuitry comprises:
a phase comparator coupled to the first local clock signal and the second local clock signal, the phase comparator configured to output a delay control signal based on a first phase of the first local clock signal and a second phase of the second local clock signal; and
a variable delay cell coupled to the delay control signal and the global clock signal of the global clock tree, the variable delay cell configured to delay the global clock signal based on the delay control signal.

22. The integrated circuit of claim 21, wherein the phase comparator is configured to output the delay control signal based on a divisor value associated with a frequency divider of the second power state controller.

23. The integrated circuit of claim 20, wherein the phase adjustment circuitry is configured to align the first local clock signal and the second local clock signal along falling edges responsive to the first local clock signal having a different frequency value than the second local clock signal.

24. The integrated circuit of claim 20, wherein the phase adjustment circuitry is configured to align the first local clock signal and the second local clock signal along opposite edges responsive to the first local clock signal having a same frequency value as the second local clock signal.

25. The integrated circuit of claim 1, wherein each respective power domain comprises:
a local power rail configured to be held at a local voltage, the local power rail coupled to the power multiplexer; and
a circuit load that is coupled to the local power rail,
wherein the power multiplexer comprises multiple power multiplexer tiles distributed along the circuit load, each power multiplexer tile configured to connect the first global power rail or the second global power rail to the local power rail.

26. The integrated circuit of claim 25, wherein the power multiplexer is configured to sequentially activate the multiple power multiplexer tiles to disconnect the first global power rail from, and to connect the second global power rail to, the local power rail so as to manage inrush current of the circuit load.

27. The integrated circuit of claim 25, wherein:
each power multiplexer tile of the multiple power multiplexer tiles includes multiple switches to connect or disconnect the first global power rail or the second global power rail to or from the local power rail; and
the power multiplexer is configured to operate the multiple switches in each power multiplexer tile so as to manage cross conduction current between the first global power rail and the second global power rail during a power multiplexing operation.

28. An integrated circuit comprising:
a first global power rail configured to be held at a first global voltage;
a second global power rail configured to be held at a second global voltage;
a global clock tree configured to propagate a global clock signal; and
multiple power domains, each power domain including:
a local power rail configured to be held at a local voltage;
a local clock tree configured to propagate a local clock signal;
a circuit load coupled to the local power rail and the local clock tree, the circuit load configured to operate using the local voltage and the local clock signal; and
power state control means for adjusting a power state of the circuit load in accordance with a duty cycle corresponding to a timeslot that is separated into multiple time periods, the power state control means configured to couple at least the first global power rail or the second global power rail to the local power rail and the global clock tree to the local clock tree.

29. The integrated circuit of claim 28, wherein the power state control means comprises:
power multiplexing means for switching the local voltage between the first global voltage and the second global voltage, the power multiplexing means coupled to the first global power rail, the second global power rail, and the local power rail.

30. The integrated circuit of claim 28, wherein the power state control means comprises:
frequency divider means for dividing a frequency value of the global clock signal to produce the local clock signal, the frequency divider means coupled to the global clock tree and the local clock tree.

31. The integrated circuit of claim 28, wherein the power state control means comprises:
duty cycle management means for managing a timing of adjustments of the power state of the circuit load based on respective durations of respective time periods of the multiple time periods of the timeslot, each respective time period corresponding to a respective power state of multiple power states.

32. The integrated circuit of claim 31, wherein the duty cycle management means comprises:

power state adjustment means for triggering a change from one power state of the multiple power states to another power state of the multiple power states responsive to expiration of a timer.

33. The integrated circuit of claim 28, further comprising:
a third global power rail configured to be held at a third global voltage,
wherein the power state control means is configured to couple at least the first global power rail, the second global power rail, or the third global power rail to the local power rail.

34. A method for power management using duty cycles, the method comprising:
distributing multiple global voltages to each of multiple power domains of an integrated circuit via multiple global power rails;
propagating a global clock signal to each of the multiple power domains of the integrated circuit via a global clock tree; and
controlling power states in the multiple power domains by, for each respective power domain having a circuit load:
distributing a local voltage to the circuit load of the respective power domain via a local power rail;
propagating a local clock signal to the circuit load of the respective power domain via a local clock tree; and
adjusting the local voltage and the local clock signal using the multiple global voltages and the global clock signal in accordance with a duty cycle corresponding to a timeslot including multiple time periods per timeslot, each respective time period corresponding to a respective power state having a voltage frequency setting.

35. The method of claim 34, wherein the adjusting comprises:
multiplexing from one global power rail to another global power rail of the multiple global power rails to adjust the local voltage on the local power rail; and
dividing a frequency value of the global clock signal to produce the local clock signal on the local clock tree.

36. The method of claim 34, wherein the multiple time periods include a first time period and a second time period; and the adjusting comprises:
operating the respective power domain at a first power state having a first voltage frequency setting during the first time period having a first duration as part of the duty cycle;
operating the respective power domain at a second power state having a second voltage frequency setting during the second time period having a second duration as part of the duty cycle; and
repeating the operating of the respective power domain at the first power state for the first duration and the operating of the respective power domain at the second power state for the second duration as part of a subsequent timeslot.

37. The method of claim 34, further comprising:
obtaining a performance level indicator signal indicative of respective updated durations of respective time periods of the multiple time periods per timeslot,
wherein the adjusting comprises adjusting the local voltage and the local clock signal based on the respective updated durations of the respective time periods across multiple timeslots.

38. The method of claim 34, wherein the adjusting comprises triggering a change to a frequency level of the local clock signal and a change to a voltage level of the local voltage based on respective durations of the multiple time periods included in each timeslot.

39. The method of claim 34, wherein the controlling comprises:
operating the circuit load based on the local voltage and the local clock signal being adjusted in accordance with the duty cycle including the multiple time periods per timeslot, the multiple time periods per timeslot having respective first durations that correspond to a first average power consumption for the circuit load;
altering lengths of the multiple time periods per timeslot to instantiate another duty cycle, the other duty cycle corresponding to the multiple time periods having respective second durations that correspond to a second average power consumption for the circuit load;
adjusting the local voltage and the local clock signal using the multiple global voltages and the global clock signal in accordance with the other duty cycle including the multiple time periods per timeslot, each respective time period corresponding to the respective power state having the voltage frequency setting; and
operating the circuit load based on the local voltage and the local clock signal being adjusted in accordance with the other duty cycle corresponding to the multiple time periods per timeslot, the multiple time periods per timeslot having the respective second durations corresponding to the second average power consumption for the circuit load.

40. An integrated circuit comprising:
a first global power rail configured to be held at a first global voltage;
a second global power rail configured to be held at a second global voltage;
a global clock tree configured to propagate a global clock signal; and
multiple power domains, each power domain including:
a local power rail configured to be held at a local voltage;
a local clock tree configured to propagate a local clock signal; and
power state control circuitry configured to implement a finite state machine, the finite state machine including:
a first power state corresponding to the local power rail being coupled to the first global power rail and the local clock signal being a function of the global clock signal and a first divisor value; and
a second power state corresponding to the local power rail being coupled to the second global power rail and the local clock signal being a function of the global clock signal and a second divisor value,
wherein the finite state machine is configured to trigger a state transition based on at least one timer derived from a duty cycle.

41. The integrated circuit of claim 40, wherein:
the at least one timer includes a first timer associated with a first duration of the first power state and a second timer associated with a second duration of the second power state;
the first power state is associated with a first power consumption, and the second power state is associated with a second power consumption; and
the power state control circuitry is configured so that the first duration and the second duration are adjustable such that an average power consumption of a respective power domain is substantially continuously variable over a timeframe including multiple timeslots, the average power consumption resulting from a combination of the first power consumption and the second power consumption over the timeframe.

42. The integrated circuit of claim 40, wherein the finite state machine further includes:
a clock cessation state in which propagation of the local clock signal is stopped;
a voltage adjustment state in which a voltage level of the local voltage is increased or decreased;
a frequency adjustment state in which a frequency value of the local clock signal is raised or lowered;
a calibration state in which a delay of the local clock signal is adjusted to align the local clock signal with the global clock signal; and
a clock engagement state in which the propagation of the local clock signal is restarted.

* * * * *